(12) United States Patent
Takahashi et al.

(10) Patent No.: US 8,159,420 B2
(45) Date of Patent: Apr. 17, 2012

(54) ELECTRO-OPTICAL DEVICE AND ELECTRONIC APPARATUS

(75) Inventors: Kasori Takahashi, Nagoya (JP); Takehiko Kubota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 997 days.

(21) Appl. No.: 11/855,615

(22) Filed: Sep. 14, 2007

(65) Prior Publication Data

US 2008/0309653 A1  Dec. 18, 2008

(30) Foreign Application Priority Data

Sep. 29, 2006 (JP) ................................. 2006-267587
Jun. 26, 2007 (JP) ................................. 2007-167251

(51) Int. Cl.
G09G 3/30 (2006.01)
(52) U.S. Cl. .......................................... 345/76; 345/83
(58) Field of Classification Search ............... 345/76–83, 345/98–100, 204–215, 690–699; 315/169.3, 315/169.1, 169.2, 169.4; 257/72, E51.005, 257/758, E51.018, E39.007; 438/149
See application file for complete search history.

(56) References Cited

U.S. PATENT DOCUMENTS

| | | | |
|---|---|---|---|
| 7,158,103 B2 | 1/2007 | Nakanishi | |
| 7,378,739 B2 * | 5/2008 | Kwak et al. | 257/758 |
| 7,462,897 B2 | 12/2008 | Endo | |
| 7,688,292 B2 * | 3/2010 | Park et al. | 345/82 |
| 2003/0103022 A1 * | 6/2003 | Noguchi et al. | 345/77 |
| 2005/0200618 A1 * | 9/2005 | Kim et al. | 345/204 |
| 2005/0243039 A1 * | 11/2005 | Kwak | 345/76 |
| 2005/0258466 A1 * | 11/2005 | Kwak et al. | 257/306 |
| 2005/0280614 A1 * | 12/2005 | Goh | 345/76 |
| 2006/0043527 A1 * | 3/2006 | Kwak | 257/532 |
| 2007/0024540 A1 * | 2/2007 | Ryu et al. | 345/76 |
| 2007/0024541 A1 * | 2/2007 | Ryu et al. | 345/76 |
| 2007/0069997 A1 | 3/2007 | Nakanishi | |
| 2008/0217624 A1 | 9/2008 | Kwak et al. | |

FOREIGN PATENT DOCUMENTS

| | | |
|---|---|---|
| JP | A 2003-332072 | 11/2003 |
| JP | A-2004-6137 | 1/2004 |
| JP | A-2005-316384 | 11/2005 |
| JP | A-2005-340772 | 12/2005 |
| JP | A 2006-030635 | 2/2006 |
| JP | A-2006-235609 | 9/2006 |

* cited by examiner

*Primary Examiner* — Alexander Eisen
*Assistant Examiner* — Patrick F Marinelli
(74) *Attorney, Agent, or Firm* — Oliff & Berridge, PLC

(57) ABSTRACT

An electro-optical device that includes: a first scanning line; a first data line; and a first unit circuit. The first unit circuit includes a driving transistor that sets a driving current in accordance with a voltage of a gate of the driving transistor, an electro-optical element that is driven by the driving current, a first capacitive element that has a first electrode and a second electrode, and a second capacitive element that has a third electrode and a fourth electrode. The first electrode is connected to the gate of the driving transistor, whereas the third electrode is connected to either the first electrode or the second electrode. At least a part of the second capacitive element is arranged between the first data line and the first capacitive element in a layout of the first unit circuit.

7 Claims, 16 Drawing Sheets

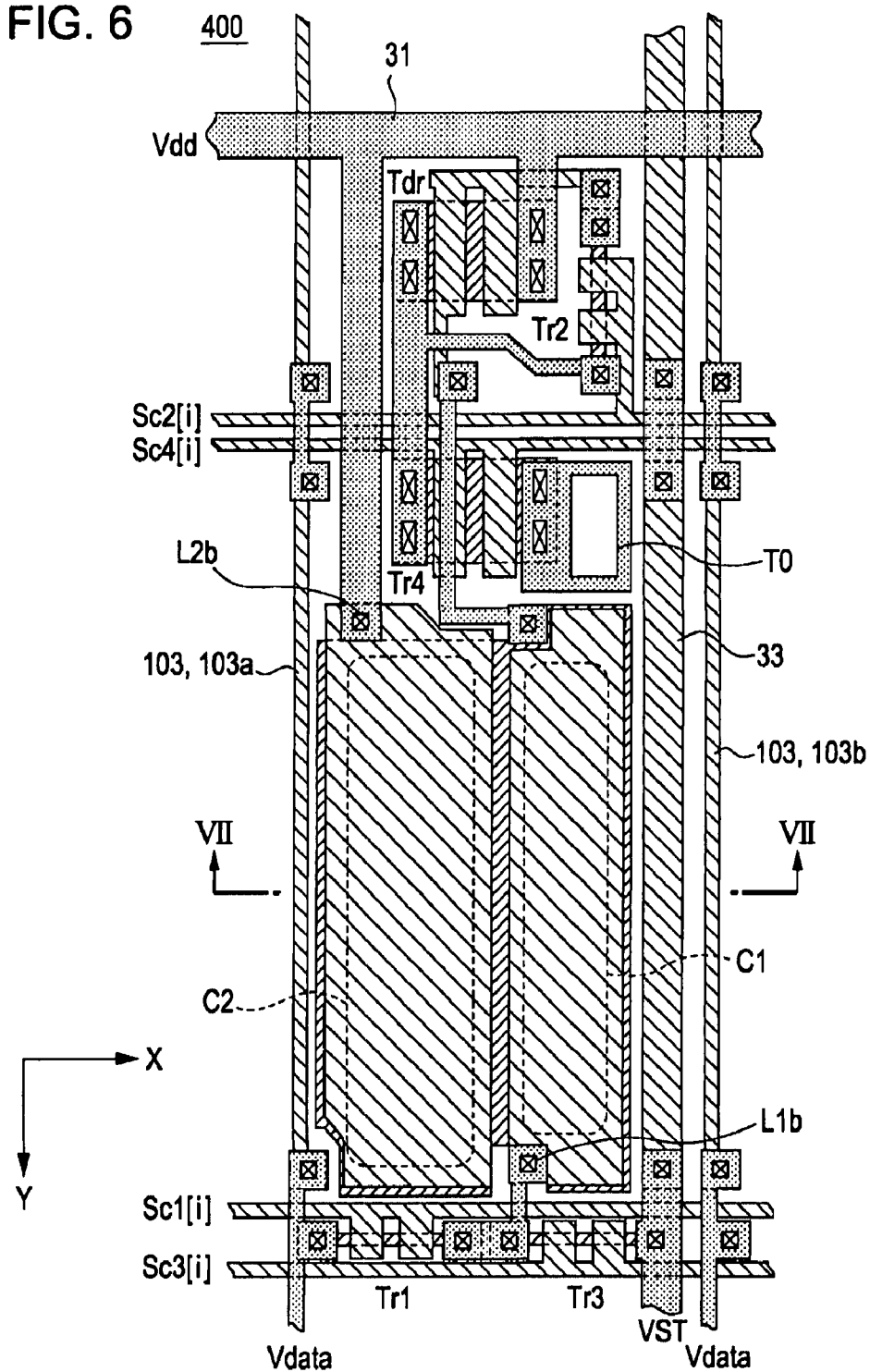
FIG. 6
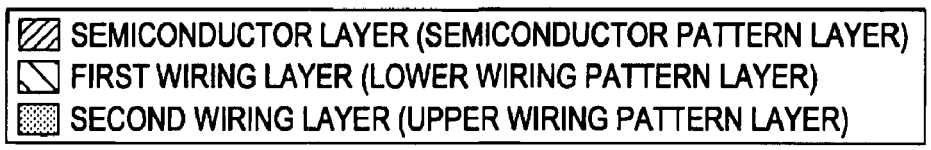

ELECTRO-OPTICAL DEVICE AND ELECTRONIC APPARATUS

BACKGROUND

1. Technical Field

The present invention relates to the characteristic layout of constituent elements that make up an electro-optical device (apparatus). The electro-optical device to which the invention is directed has electro-optical elements such as light-emitting elements made of organic electroluminescent (EL) material or the like. The invention further relates to an electronic apparatus that is provided with such an electro-optical device.

2. Related Art

The above type of electro-optical element changes its gradation (typically, luminance) when a current is supplied thereto. In this respect, a configuration for controlling the current supplied thereto (hereafter referred to as a "driving current") by means of a transistor (hereafter referred to as a "driving transistor") is known in the art. Disadvantageously, the known configuration has a problem of nonuniformity among the gradations offered by electro-optical elements. That is, the gradations could vary from one electro-optical element to another because of the individual specificity (i.e., difference) of driving transistor characteristics, in particular, differences in threshold voltages thereof. In order to reduce nonuniformity in gradations, for example, JP-A-2003-332072 (specifically, FIG. 1 thereof) and JP-A-2006-30635 (specifically, FIGS. 1-3 thereof) disclose a technique for compensating for differences in the threshold voltages of the driving transistors.

FIG. 17 is a circuit diagram that illustrates the configuration of a pixel circuit P0 that is described in JP-A-2003-332072. As illustrated in FIG. 17, a transistor Tr1 is interposed between the gate electrode of a driving transistor Tdr and the drain electrode thereof. One terminal of a capacitative element C1, specifically, an electrode L2 thereof, is connected to the gate electrode of the driving transistor Tdr. A retention volume C2, in other words, a hold capacitor, is a capacitance interposed between the gate electrode of the driving transistor Tdr and the source electrode thereof. A transistor Tr2 is a switching element that is interposed between a data line 103 and the other terminal of the capacitative element C1, an electrode L1, so as to switch conduction (i.e., continuity)/non-conduction between the data line 103 and the electrode L1 of the capacitative element C1. The data line 103 supplies a potential (i.e., voltage) VD that is in accordance with luminance specified for an organic light-emitting diode element 110. The potential VD according to the specified luminance is hereafter referred to as a "data potential". The organic light-emitting diode element 110 is hereafter abbreviated as an "OLED element" 110.

The operation of the above-described configuration is explained below. As the first step, a signal S2 is supplied to turn the transistor Tr1 into an ON state. When the driving transistor Tdr is "diode-connected" through the transition of the transistor Tr1 into an ON state, the gate potential of the driving transistor Tdr converges into "VEL−Vth" (where "Vth" denotes the threshold voltage of the driving transistor Tdr). As the second step, a signal S1 is supplied to turn a transistor Tr2 into an ON state while turning the transistor Tr1 OFF. With such an ON/OFF setting, electrical conduction between the electrode L1 of the capacitative element C1 and the data line 103 is established. Through the above operation, the potential of the gate electrode of the driving transistor Tdr changes from the immediately previous voltage level by the level amount calculated by dividing the potential change that occurs at the first electrode L1 of the capacitative element C1 in proportion to the ratio of an electrostatic capacity (i.e., capacitance) of the first capacitative element C1 to an electrostatic capacity of the retention volume C2. That is, it changes by the level amount in accordance with the data potential VD. As the third step, a signal S3 is supplied to turn a transistor Te1 into an ON state while turning the transistor Tr2 OFF. As a result of the above operation, a driving current Iel that does not depend on the threshold voltage Vth is supplied to the OLED element 110 via the driving transistor Tdr and the transistor Te1. The fundamental principle adopted in JP-A-2006-30635 for compensation of the threshold voltage Vth of the driving transistor Tdr is the same as above.

As illustrated in FIG. 18, for example, in the layout of the above-described pixel circuit, the first capacitative element C1 is arranged between the data line and a power line. For this reason, parasitic capacitance is generated between a conductor wiring that constitutes the first capacitative element C1 and another conductor wiring that constitutes the data line 103. In particular, when a crosstalk is generated between the first capacitative element C1 and the data line 103 via the generated parasitic capacitance so as to change the voltage of the first capacitative element C1, the gate potential of the driving transistor Tdr changes. This causes a change in the driving current Iel in accordance with the changed gate potential. For this reason, the luminance of the OLED element 110 changes.

The pixel circuit described in JP-A-2006-30635 is configured to have a metal shield that surrounds the capacitative elements C1 and C2, thereby minimizing the electric field effects of the data line. However, disadvantageously, such a configuration requires an additional space for providing the metal shield, which makes it more difficult to achieve a high degree of integration of elements.

SUMMARY

An advantage of some aspects of the invention is to reduce a change in the gate potential of a driving transistor so as to enhance display quality.

The invention can be implemented as described in the following exemplary embodiments, variations thereof, or application examples thereof.

APPLICATION EXAMPLE 1

An electro-optical device according to one implementation example of the invention includes: a plurality of scanning lines that include a first scanning line; a plurality of data lines that include a first data line; a plurality of unit circuits that include a first unit circuit, the plurality of unit circuits being provided at positions corresponding to intersections of the plurality of scanning lines and the plurality of data lines; and a plurality of power lines each of which supplies a power voltage. In such a configuration, the first unit circuit includes a driving transistor that sets a driving current in accordance with a voltage of a gate of the driving transistor, an electro-optical element that is driven by the driving current, a first capacitative element that has a first electrode and a second electrode, a first switching element that controls electric connection between the first data line and the second electrode of the first capacitative element on the basis of a control signal that is supplied via the first scanning line, and a second capacitative element that has a third electrode and a fourth electrode. In such a configuration, the driving transistor has a first terminal and a second terminal. In addition, the first terminal of the driving transistor is connected to the power line. Further, in addition to the above, the first electrode of the first capacitive element is connected to the gate of the driving transistor, whereas the third electrode of the second capacitative element is connected to either the gate of the driving transistor or the second electrode of the first capacitive element. Further, in addition to the above, at least a part of the second capacitive element is arranged between the first data line and the first capacitive element in a layout of the first unit circuit. An electro-optical device according to one implementation example of the invention has a configuration described above. It should be particularly noted that, when the electro-optical device is configured as shown in FIG. 4 or FIG. 6, which will be described later, at least a part of the second capacitive element is arranged between the first data line and the first capacitive element in a plain view.

The electro-optical device according to the application example of the invention described above makes it possible to reduce parasitic capacitance between the data line and the first capacitive element because the second capacitive element is arranged between the data line and the first capacitative element.

APPLICATION EXAMPLE 2

An electro-optical device according to another implementation example of the invention may further include a plurality of potential lines each of which supplies a predetermined potential. In such a configuration, the plurality of data lines may include a second data line. In addition, the potential line may extend in a direction in which the first data line and the second data line extend. Further, in addition to the above, the first capacitive element may be arranged between the second capacitive element and the potential line in such a manner that the second capacitive element, the first capacitive element, and the potential line are interposed between the first data line and the second data line.

It should be particularly noted that, when the electro-optical device is configured as shown in FIG. 4 or FIG. 6, which will be described later, the first capacitive element is arranged between the second capacitive element and the potential line in such a manner that the second capacitive element, the first capacitive element, and the potential line are interposed between the first data line and the second data line in a plain view.

APPLICATION EXAMPLE 3

In the configuration of an electro-optical device according to still another implementation example of the invention, the plurality of data lines may include a second data line. In addition, the first capacitive element may be arranged between the second capacitive element and an area over which the electro-optical element is provided in such a manner that the second capacitive element, the first capacitive element, and the area over which the electro-optical element is provided are interposed between the first data line and the second data line.

In the layout of the electro-optical device according to the application example of the invention described above, the second capacitive element or the area over which the electro-optical element is provided is arranged between the first data line and the first capacitive element or between the first capacitive element and the second data line. Therefore, the electro-optical device according to the application example of the invention described above makes it possible to prevent any potential change of the first data line and the second data line from adversely affecting the first capacitive element.

APPLICATION EXAMPLE 4

In the configuration of an electro-optical device according to still another implementation example of the invention, either one or both of the first capacitive element and the second capacitive element may be arranged under an area at which the electro-optical element is provided.

APPLICATION EXAMPLE 5

In the configuration of an electro-optical device according to still another implementation example of the invention, the third electrode of the second capacitive element may be connected to the second electrode of the first capacitive element. In such a configuration, the first unit circuit may have a semiconductor pattern layer, an insulating layer, and a wiring pattern layer. The semiconductor pattern layer may include a first semiconductor film of the driving transistor, the first electrode of the first capacitive element, and the fourth electrode of the second capacitive element. The insulating layer may cover the semiconductor pattern layer. The wiring pattern layer, which is deposited on the insulating layer, may include the second electrode of the first capacitive element and the third electrode of the second capacitive element. In addition, the second electrode of the first capacitive element and the third electrode of the second capacitive element may be constituted by a common film. Further, in addition to the above, the fourth electrode of the second capacitive element may be provided between the first data line and the first electrode of the first capacitive element. Further, in addition to the above, the fourth electrode of the second capacitive element may be electrically connected to the power line.

The electro-optical device according to the application example of the invention described above makes it possible to reduce a coupling capacitance between the first data line and the first electrode of the first capacitive element because the fourth electrode of the second capacitive element is interposed between the first data line and the first electrode of the first capacitive element and because the fourth electrode of the second capacitive element is electrically connected to the power line.

APPLICATION EXAMPLE 6

In the configuration of an electro-optical device according to still another implementation example of the invention, the third electrode of the second capacitive element may be connected to the gate of the driving transistor. In such a configuration, the first unit circuit may have a semiconductor pattern layer, an insulating layer, and a wiring pattern layer. The semiconductor pattern layer may include a first semiconductor film of the driving transistor, the first electrode of the first capacitive element, and the third electrode of the second capacitive element. The insulating layer may cover the semiconductor pattern layer. The wiring pattern layer, which is deposited on the insulating layer, may include the second electrode of the first capacitive element and the fourth electrode of the second capacitive element. In addition, the first electrode of the first capacitive element and the third electrode of the second capacitive element may be constituted by a second semiconductor film that is provided as a common film.

In the layout of the electro-optical device according to the application example of the invention described above, if the plurality of data lines are formed in a layer above the semiconductor pattern layer or the wiring pattern layer, it follows that the layer in which the plurality of data lines are formed is not the same as one in which the first electrode of the first capacitative element is formed. Therefore, it is possible to distance the plurality of data lines away from the first electrode of the first capacitative element in a three-dimensional layout. Thus, it is further possible to reduce a coupling capacitance between the plurality of data lines and the first electrode of the first capacitative element.

APPLICATION EXAMPLE 7

In the configuration of an electro-optical device according to still another implementation example of the invention, the third electrode of the second capacitative element may be connected to the gate of the driving transistor. In such a configuration, the first unit circuit may have a semiconductor pattern layer, an insulating layer, and a wiring pattern layer. The semiconductor pattern layer may include a first semiconductor film of the driving transistor, the second electrode of the first capacitative element, and the fourth electrode of the second capacitative element. The insulating layer may cover the semiconductor pattern layer. The wiring pattern layer, which is deposited on the insulating layer, may include the first electrode of the first capacitative element and the third electrode of the second capacitative element. In addition, the first electrode of the first capacitative element and the third electrode of the second capacitative element may be constituted by a common film.

APPLICATION EXAMPLE 8

In the configuration of an electro-optical device according to still another implementation example of the invention, the third electrode of the second capacitative element may be connected to the second electrode of the first capacitative element. In such a configuration, the first unit circuit may have a semiconductor pattern layer, an insulating layer, and a wiring pattern layer. The semiconductor pattern layer may include a first semiconductor film of the driving transistor, the second electrode of the first capacitative element, and the third electrode of the second capacitative element. The insulating layer may cover the semiconductor pattern layer. The wiring pattern layer, which is deposited on the insulating layer, may include the first electrode of the first capacitative element and the fourth electrode of the second capacitative element. In addition, the second electrode of the first capacitative element and the third electrode of the second capacitative element may be constituted by a common film.

Generally speaking, a wiring pattern has a greater thickness than a semiconductor pattern. If the first electrode of the first capacitative element and the third electrode of the second capacitative element are constituted by a common film as described in Application Example 7, or if the second electrode of the first capacitative element and the third electrode of the second capacitative element are constituted by a common film as described in Application Example 8, it is not necessary to perform patterning on these electrodes, which helps in avoiding the formation of surface unevenness due to wire-patterning. Therefore, if such a configuration is adopted, it is possible to provide the electro-optical device on a relatively smooth surface over these electrodes.

APPLICATION EXAMPLE 9

An electro-optical device according to still another implementation example of the invention includes: a plurality of scanning lines that include a first scanning line; a plurality of data lines that include a first data line; a plurality of unit circuits that include a first unit circuit, the plurality of unit circuits being provided at positions corresponding to intersections of the plurality of scanning lines and the plurality of data lines; a plurality of power lines each of which supplies a power voltage; and a plurality of potential lines each of which supplies a predetermined potential. In such a configuration, the first unit circuit includes a driving transistor that sets a driving current in accordance with a voltage of a gate of the driving transistor, an electro-optical element that is driven by the driving current, a first capacitative element that has a first electrode and a second electrode, a second capacitative element that has a third electrode and a fourth electrode, a first switching element that controls electric connection between the first data line and the second electrode of the first capacitative element on the basis of a control signal that is supplied via the first scanning line, a second switching element, and a third switching element that controls electric connection between the second electrode of the first capacitative element and the potential line. In such a configuration, the driving transistor has a first terminal and a second terminal. In addition, the first terminal of the driving transistor is connected to the power line. Further, in addition to the above, the first electrode of the first capacitative element is connected to the gate of the driving transistor, whereas the third electrode of the second capacitative element is connected to either the gate of the driving transistor or the second electrode of the first capacitative element. Further, in addition to the above, the second switching element controls electric connection between the second terminal of the driving transistor and the gate of the driving transistor. Further, in addition to the above, at least a part of the second capacitative element is arranged between the first data line and the first capacitative element in a layout of the first unit circuit. An electro-optical device according to still another implementation example of the invention has a configuration described above.

In the layout of the electro-optical device according to the application example of the invention described above, the third switching element (i.e., third transistor) is turned ON during an initialization period so as to supply an initialization potential (in other words, initialization voltage, which is the "predetermined potential" described above) to the second electrode of the first capacitative element; the first switching element (i.e., first transistor) is turned ON during a data signal writing period so as to write a data signal into the second electrode of the first capacitative element; and both of the first switching element and the third switching element are turned OFF during a light emission period. If the above-described ON/OFF operations are conducted, the second electrode of the first capacitative element is in a floating state during the light emission period. Therefore, just for the purpose of hypothetical discussion, if is assumed here that a large parasitic capacitance exists between the data line and the second electrode of the first capacitative element, the voltage of the first electrode of the first capacitative element changes in accordance with a voltage change of the data line, which results in a change in the level of a driving current. However, advantageously, the electro-optical device according to the application example of the invention described above makes it possible to reduce parasitic capacitance between the data line and the first capacitative element because the second capacitative element is arranged between the data line and the first capacitative element.

APPLICATION EXAMPLE 10

An electronic apparatus according to one implementation example of the invention is provided with the electro-optical device having any of the above-described configurations.

APPLICATION EXAMPLE 11

An electro-optical device according to still another implementation example of the invention may include a plurality of scanning lines; a plurality of data lines; a plurality of unit circuits (denoted as 400 in FIG. 1, though not limited thereto) that are provided at positions corresponding to intersections of the plurality of scanning lines and the plurality of data lines; and a plurality of power lines (denoted as 31 in FIG. 1, though not limited thereto) each of which supplies a power voltage. In such a configuration, each of the plurality of unit circuits includes a driving transistor, an electro-optical element, a first capacitative element, a first switching element, and a second capacitative element. Herein, the driving transistor has a first terminal that is connected to the power line, a second terminal, and a gate. The current level of a driving current that flows between the first terminal of the driving transistor and the second terminal thereof changes in accordance with the voltage of the gate thereof. The driving current drives the electro-optical element. The first capacitative element has the first electrode (denoted as L1$a$ in FIG. 2, though not limited thereto) and the second electrode (denoted as L1$b$ in FIG. 2, though not limited thereto). The first electrode of the first capacitative element is connected to the gate of the driving transistor. A control signal supplied through the scanning line controls the first switching element (denoted as Tr1 in FIG. 2, though not limited thereto) so as to switch electrical connection between the data line and the second electrode of the first capacitative element. When turned ON, the first switching element supplies a data signal of the data line to the gate of the driving transistor via the first capacitative element. The second capacitative element has the third electrode and the fourth electrode. The second capacitative element functions to hold the potential of either the gate of the driving transistor or the second electrode of the first capacitative element when the driving current is supplied from the driving transistor to the electro-optical element. In addition, the first capacitative element and the second capacitative element are arranged adjacent to each other. Further, in addition to the above, a part or a whole of the second capacitative element is arranged between the data line and the first capacitative element.

The electro-optical device according to the application example of the invention described above makes it possible to reduce parasitic capacitance between the data line and the first capacitative element because the second capacitative element is arranged between the data line and the first capacitative element. Therefore, the invention suppresses a crosstalk, that is, a phenomenon in which the voltage change of the data line causes a change in the gate voltage of the driving transistor. For this reason, it is possible to significantly improve display quality. It should be noted that the entire configuration of the second capacitative element does not have to be interposed between the data line and the first capacitative element. It is sufficient only if a part thereof is arranged therebetween. For example, a connection line that connects the first capacitative element and the driving transistor may be arranged at a position closer to the data line than the second capacitative element. Even in such a configuration, the first capacitative element is provided at a position opposite to the data line with a part of the second capacitative element interposed therebetween. Therefore, it is possible to reduce parasitic capacitance.

APPLICATION EXAMPLE 12

An electro-optical device having the above-described configuration may further include a plurality of potential lines each of which supplies an initialization voltage. In such a configuration, it is preferable that the potential line extends in parallel with the data line, and that the data line of a certain unit circuit, the second capacitative element, the first capacitative element, the potential line, and the data line of another unit circuit that is arranged adjacent to the first-mentioned unit circuit is arranged in the order of appearance herein.

In the layout of the electro-optical device according to the application example of the invention described above, the potential line is interposed between the first capacitative element and the data line of another unit circuit that is arranged adjacent to the first-mentioned unit circuit. Since a fixed initialization potential is supplied to the potential line, it is possible to significantly reduce parasitic capacitance between the first capacitative element and the data line of another unit circuit that is arranged adjacent to the first-mentioned unit circuit. As a result thereof, it is possible to suppress crosstalk from the data line of the first-mentioned unit circuit and from the data line of another unit circuit that is arranged adjacent to the first-mentioned unit circuit. This makes it possible to further enhance display quality. In Application Example 12, "the potential line extends in parallel with the data line" means that the potential line and the data line are arranged in such a manner that they do not intersect each other. Therefore, the technical and legal scope of the invention also encompasses a case where the potential line is, in an exact meaning, not in parallel with the data line due to a manufacturing error or any other reason despite its intention to form the potential line and the data line in parallel with each other.

APPLICATION EXAMPLE 13

In the configuration of an electro-optical device according to still another implementation example of the invention, the second electrode of the first capacitative element, the fourth electrode of the second capacitative element, the plurality of data lines, and the plurality of potential lines may be constituted by the same single wiring layer, and the electro-optical element may be provided in a layer that lies over the wiring layer.

In the layout of the electro-optical device according to the application example of the invention described above, since the second electrode of the first capacitative element, the fourth electrode of the second capacitative element, the plurality of data lines, and the plurality of potential lines are formed in the wiring layer, it is possible to smoothen a base underlying the layer in which the electro-optical device is provided. Therefore, it is possible to form the electro-optical element over the approximately flat base. As a result thereof, it is possible to make the characteristics of the electro-optical element uniform.

APPLICATION EXAMPLE 14

In the configuration of an electro-optical device according to still another implementation example of the invention, the driving transistor may have a semiconductor layer and an insulating layer deposited on the semiconductor layer. In such a configuration, the wiring layer may be deposited on the insulating layer. In addition, the first electrode of the first capacitative element and the third electrode of the second capacitative element may be formed in the semiconductor layer.

In the layout of the electro-optical device according to the application example of the invention described above, the first capacitative element is made up of the first electrode thereof that is formed in the semiconductor layer, the second electrode thereof that is formed in the wiring layer, and an insulating film provided therebetween, whereas the second capacitative element is made up of the third electrode thereof that is formed in the semiconductor layer, the fourth electrode thereof that is formed in the wiring layer, and the insulating film provided therebetween. Therefore, it is possible to increase a capacitance value per unit area. As a result thereof, it is possible to make an area occupied by each of the first capacitative element and the second capacitative element smaller.

APPLICATION EXAMPLE 15

In the configuration of an electro-optical device according to still another implementation example of the invention, each of the plurality of unit circuits described above may further include a second switching element that controls electric connection between the second terminal of the driving transistor and the gate of the driving transistor, and a third switching element that controls electric connection between the second electrode of the first capacitative element and the potential line. In such a configuration, it is preferable that none of the first capacitative element, the second capacitative element, the driving transistor, and the first switching element is arranged under the area at which the electro-optical element is provided. When the electro-optical element is configured as a bottom-emission type one which emits light at a side where the semiconductor layer and the wiring layer are deposited, each of the plurality of unit circuits described above may further include a second switching element that controls electric connection between the second terminal of the driving transistor and the gate of the driving transistor, and a third switching element that controls electric connection between the second electrode of the first capacitative element and the potential line. In such a configuration, it is preferable that none of the first capacitative element, the second capacitative element, the driving transistor, and the first switching element is arranged under the area at which the electro-optical element is provided. In addition, in such a configuration, it is preferable that neither of the second switching element and the third switching element is arranged under the area at which the electro-optical element is provided.

In the layout of the electro-optical device according to the application example of the invention described above, no wiring, capacitative element, transistor, nor switching element is arranged under the area at which the electro-optical element is provided. Therefore, light is not shut off by such a component.

APPLICATION EXAMPLE 16

In the configuration of an electro-optical device according to still another implementation example of the invention, it is preferable that either one or both of the first capacitative element and the second capacitative element is/are arranged under an area at which the electro-optical element is provided. When the electro-optical element is configured as a top-emission type one which emits light at a side opposite to the aforementioned side where the semiconductor layer and the wiring layer are deposited, it is preferable that a part or a whole of the first capacitative element, and a part or a whole of the second capacitative element are arranged under the area at which the electro-optical element is provided.

In the layout of the electro-optical device according to the application example of the invention described above, it is possible to configure the area at which the first capacitative element and the second capacitative element are formed as a layer underlying the area at which the electro-optical element is provided in a three-dimensional structure. Such a 3D layout makes it possible to increase an aperture ratio so as to display high-resolution images.

APPLICATION EXAMPLE 17

An electro-optical device according to still another implementation example of the invention may include a plurality of scanning lines; a plurality of data lines; a plurality of unit circuits (denoted as 400 in FIG. 1, though not limited thereto) that are provided at positions corresponding to intersections of the plurality of scanning lines and the plurality of data lines; a plurality of power lines (denoted as 31 in FIG. 1, though not limited thereto) each of which supplies a power voltage; and a plurality of potential lines each of which supplies an initialization voltage (denoted as 33 in FIG. 1, though not limited thereto). In such a configuration, each of the plurality of unit circuits includes a driving transistor, an electro-optical element, a first capacitative element, a second capacitative element, a first switching element, a second switching element, and a third switching element. Herein, the driving transistor has a first terminal that is connected to the power line, a second terminal, and a gate. The current level of a driving current that flows between the first terminal of the driving transistor and the second terminal thereof changes in accordance with the voltage of the gate thereof. The driving current drives the electro-optical element. The first capacitative element has the first electrode (denoted as L1$a$ in FIG. 2, though not limited thereto) and the second electrode (denoted as L1$b$ in FIG. 2, though not limited thereto). The first electrode of the first capacitative element is connected to the gate of the driving transistor. The second capacitative element has the third electrode (denoted as L2$a$ in FIG. 2, though not limited thereto) and the fourth electrode (denoted as L2$b$ in FIG. 2, though not limited thereto). The third electrode of the second capacitative element is connected to the gate of the driving transistor, whereas the fourth electrode of the second capacitative element is connected to the power line. On the basis of a control signal supplied through the scanning line, the first switching element (denoted as Tr1 in FIG. 2, though not limited thereto) controls electrical connection between the data line and the second electrode of the first capacitative element. The second switching element (denoted as Tr2 in FIG. 2, though not limited thereto) controls electric connection between the second terminal of the driving transistor and the gate of the driving transistor. The third switching element (denoted as Tr3 in FIG. 2, though not limited thereto) controls electric connection between the second electrode of the first capacitative element and the potential line. In addition, the first capacitative element and the second capacitative element are arranged adjacent to each other. Further, in addition to the above, a part or a whole of the second capacitative element is arranged between the data line and the first capacitative element.

In the layout of the electro-optical device according to the application example of the invention described above, the third switching element (i.e., third transistor) is turned ON during an initialization period so as to supply an initialization potential (i.e., voltage) to the second electrode of the first capacitative element. Then, the first switching element (i.e., first transistor) is turned ON during a data-signal-writing period so as to write a data signal into the second electrode of the first capacitative element. Both of the first switching element and the third switching element are turned OFF during a light emission period. Accordingly, if the above-described ON/OFF operations are conducted, the second electrode of the first capacitative element is in a floating state during the light emission period. Therefore, if is assumed here that a large parasitic capacitance exists between the data line and the second electrode of the first capacitative element, the voltage of the first electrode of the first capacitative element changes in accordance with a voltage change of the data line, which results in a change in the level of a driving current. The electro-optical device according to the application example of the invention described above makes it possible to reduce parasitic capacitance between the data line and the first capacitative element because the second capacitative element is arranged between the data line and the first capacitative element. Therefore, the invention suppresses a crosstalk, that is, a phenomenon in which the voltage change of the data line causes a change in the gate voltage of the driving transistor. For this reason, it is possible to significantly improve display quality. It should be noted that the entire configuration of the second capacitative element does not have to be interposed between the data line and the first capacitative element. It is sufficient only if a part thereof is arranged therebetween. For example, a connection line that connects the first capacitative element and the driving transistor may be arranged at a position closer to the data line than the second capacitative element. Even in such a configuration, the first capacitative element is provided at a position opposite to the data line with a part of the second capacitative element interposed therebetween. Therefore, it is possible to reduce parasitic capacitance.

In still another implementation example of the invention, an electronic apparatus may be provided with the electro-optical device having any of the above-described configurations. Such an electronic apparatus may be embodied as a mobile phone, a personal computer, or an electronic still camera. However, the foregoing has no intention to limit its application to these specific examples. It should be noted that the application/use of the electro-optical device according to the invention is not limited to image display. That is, the electro-optical device according to the invention may be adopted as, for example, means for exposing an image carrier to light (so-called exposure head) in an image forming apparatus (e.g., printing apparatus) that is configured to form a latent image onto the image carrier such as a photosensitive drum or the like by irradiation of a light beam.

BRIEF DESCRIPTION OF THE DRAWINGS

The invention will be described with reference to the accompanying drawings, wherein like numbers reference like elements.

FIG. 6 is a plane view that conceptually illustrates the exemplary configuration of the substantial part of the electro-optical device according to a variation example of the invention.

DESCRIPTION OF EXEMPLARY EMBODIMENTS

A: Configuration of Electro-Optical Device

Figure 1:
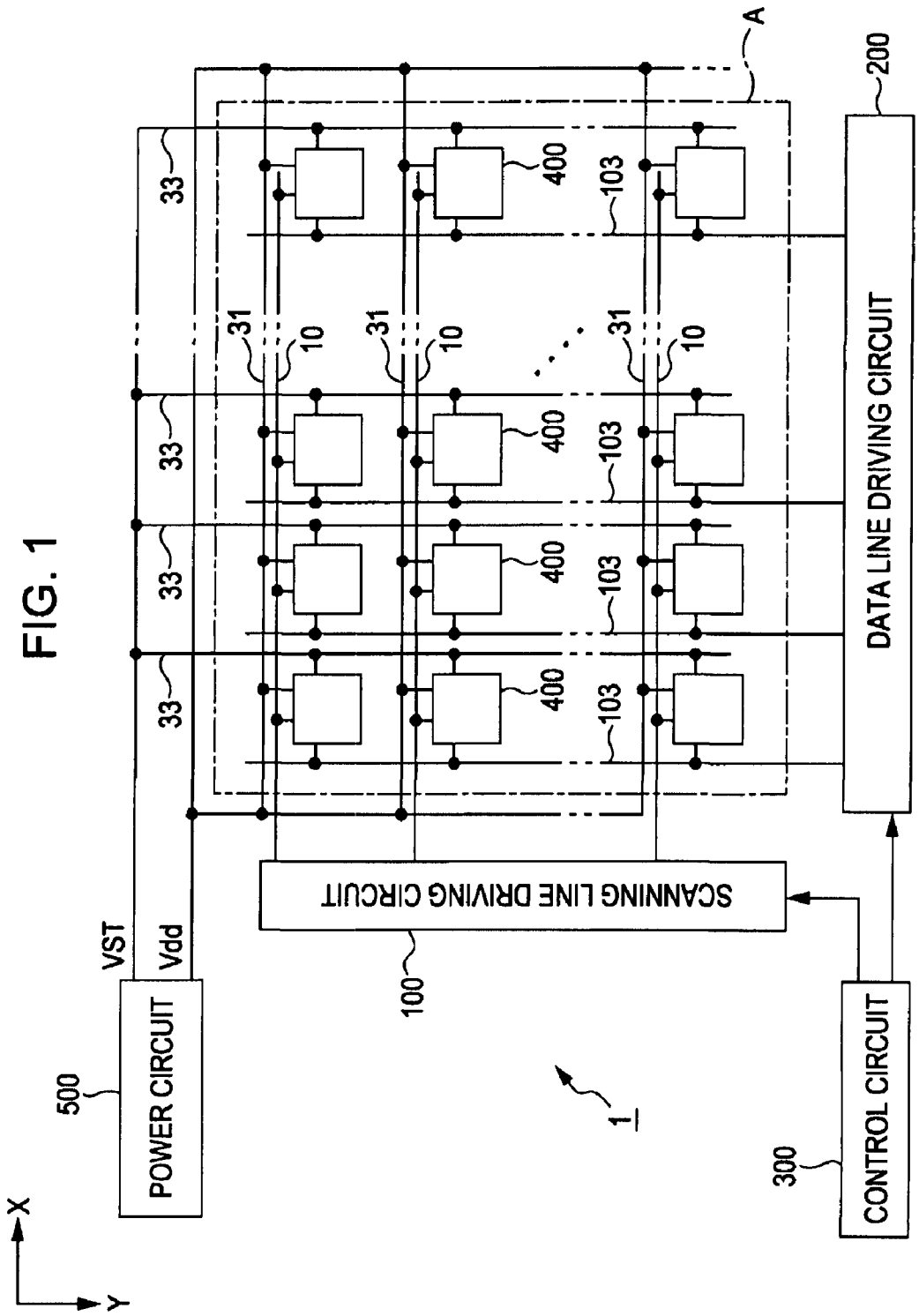
FIG. 1 is a block diagram that schematically illustrates an example of the configuration of an electro-optical device according to an embodiment of the invention.
Figure 2:
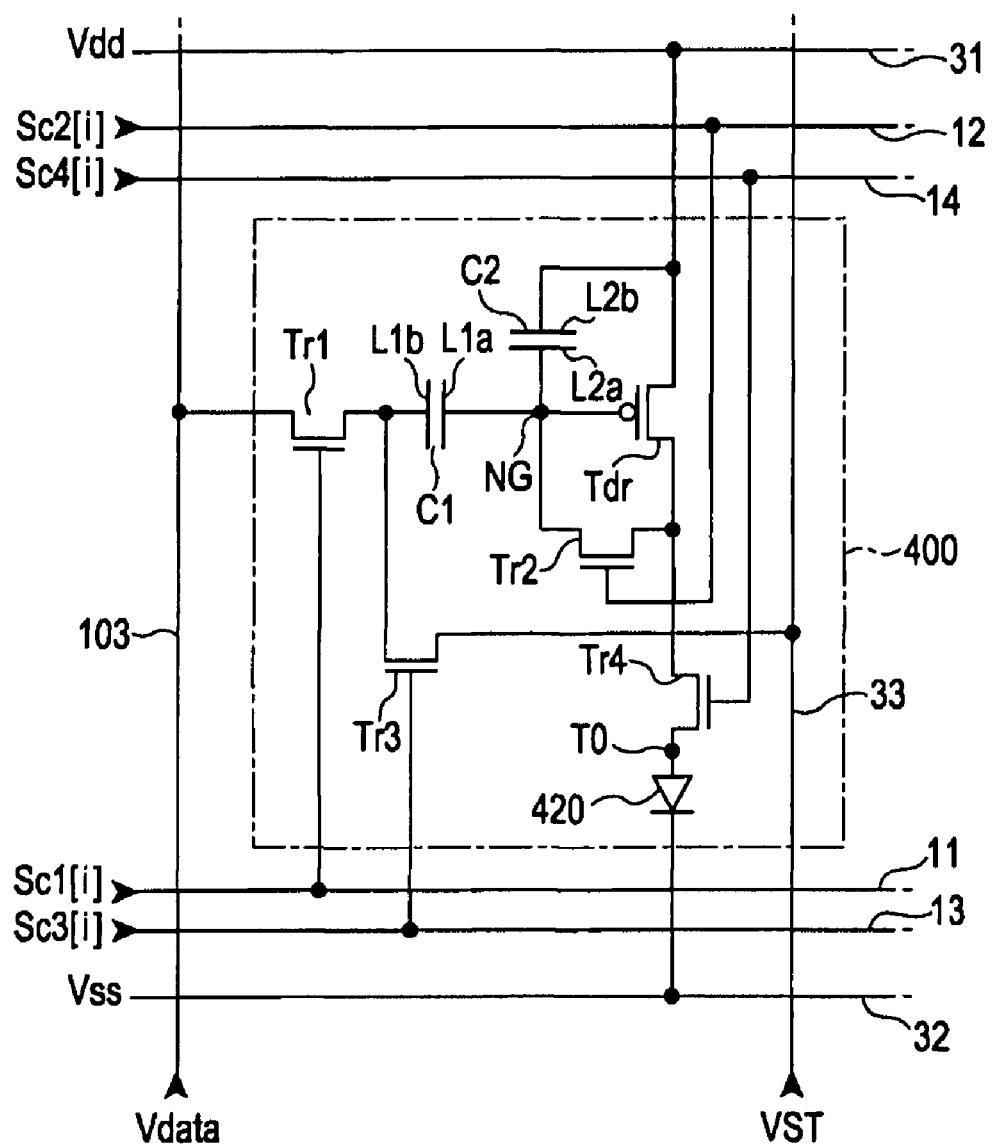
FIG. 2 is a circuit diagram that schematically illustrates an example of the configuration of a pixel circuit according to the embodiment of the invention.

With reference to FIGS. 1 and 2, an electro-optical device according to the present embodiment of the invention is explained below. FIG. 1 is a block diagram that schematically illustrates an example of the configuration of an electro-optical device according to the present embodiment of the invention. As illustrated in FIG. 1, an electro-optical device 1 is provided with a pixel region A, a scanning line driving circuit 100, a data line driving circuit 200, a control circuit 300, and a power circuit 500. The pixel region A has a plurality of signal lines formed thereon. These signal lines include M number of scanning lines 10 each of which extends in the X direction, M number of power lines 31 each of which extends in the X direction in such a manner that each of the power lines 31 and the corresponding one of the scanning lines 10 constitute a pair of the X-direction signal lines, and N number of data lines 103 each of which extends in the Y direction orthogonal to the X direction. A pixel circuit 400 is provided at a position corresponding to each intersection of the scanning lines 10 and the data lines 103. This means that these pixel circuits 400 are arrayed in a matrix of M rows and N columns.

The scanning line driving circuit 100 is a circuit that functions to select the pixel circuits 400 arranged in the pixel region A on a row-by-row basis at each horizontal scanning period so as to operate the selected pixel circuits 400. On the other hand, the data line driving circuit 200 is a circuit that functions to generate a data voltage Vdata corresponding to each one of a row of the pixel circuits 400 selected by the scanning line driving circuit 100, that is, each one of the selected N number of the pixel circuits 400, and outputs each of the generated data voltages to the corresponding one of the data lines 103. Herein, the data voltage Vdata is a voltage corresponding to gradation (luminance) that is specified for each of the pixel circuits 400.

The control circuit 300 controls the scanning line driving circuit 100 and the data line driving circuit 200 by supplying various kinds of control signals such as a clock signal to these driving circuits. In addition, the control circuit 300 supplies image data that specifies the gradation of each of the pixel circuits 400 to the data line driving circuit 200. On the other hand, the power circuit 500 generates a high-side voltage (hereafter referred to as "power voltage") Vdd, a low-side voltage (hereafter referred to as "ground voltage") Vss, and an initialization voltage/potential VST. The power voltage vdd is supplied to each of the pixel circuits 400 via the power line 31. The ground voltage Vss is supplied to each of the pixel circuits 400 via a designated signal line (specifically, a ground wire 32 illustrated in FIG. 2). The ground voltage Vss serves as a reference potential/voltage. The initialization voltage VST is supplied to each of the pixel circuits 400 via an initialization power line 33.

Next, with reference to FIG. 2, an example of the configuration of each pixel circuit 400 is explained below. It should be noted that FIG. 2 illustrates only one pixel circuit 400 provided at the i-th row and the j-th column, where "i" is an integer that satisfies the mathematical condition of $1 \leq i \leq M$, and "j" is an integer that satisfies the mathematical condition of $1 \leq j \leq N$. Other pixel circuits 400 that are not shown in this figure have the same configuration as that of the illustrated one. It should be further noted that the conductivity type of each of transistors that make up the pixel circuit 400 is not limited to one that is illustrated in FIG. 2. It should be still further noted that the configuration and/or material of each of the transistors shown in FIG. 2 is not limited by that/those illustrated therein although FIG. 2 shows, as a typical example thereof, a thin film transistor that includes low-temperature polysilicon in a semiconductor layer thereof.

AS illustrated in FIG. 2, the pixel circuit 400 includes an OLED element 420 and a p-channel type transistor (hereafter referred to as "driving transistor") Tdr. The OLED element 420 and the driving transistor Tdr are provided between the power line 31 through which the power voltage Vdd is supplied and the ground wire 32 through which the ground voltage Vss is supplied. The OLED element 420 is a light-emitting device that emits light with luminance in accordance with a current that flows in the forward direction thereof (hereafter referred to as "driving current"). The OLED element 420 has a light-emitting layer that is made of an organic EL material between the positive pole (i.e., positive electrode) and the negative pole thereof. The light-emitting layer is formed by, for example, discharging the liquid drops of an organic EL material from an ink-jet type (liquid-drop-discharging type) head and then drying thereof. The negative pole of the OLED element 420 is connected to the ground wire 32. The driving transistor Tdr is a transistor that controls a driving current that flows through the OLED element 420.

A low-molecular organic EL material, a high-molecular organic EL material, a dendrimer organic EL material, or the like, is used as the material for the OLED element 420. Note that the OLED element 420 is nothing more than an example of various kinds of light-emitting devices. Specifically, as an example of substitutes for the OLED element 420, various kinds of self-light-emitting devices may be used, including but not limited to, an inorganic EL device, a field emission (FE) device, a surface conduction electron emitter (SE) device, a ballistic electron surface emitting (BS) device, a light emitting device (LED). In addition, an electrophoresis device or an electro-chromic device may be used as another example of substitutes therefor. Similar to the specific example explained in the present embodiment described herein, the invention is also applicable to a light exposure device such as a writing head used for an optical-writing type printer and/or electronic copying machine. Moreover, the invention is further applicable to a variety of other devices/apparatuses, including, without any limitation thereto, a bio-chip sensor apparatus.

Although each of the scanning lines 10 is illustrated in FIG. 1 as a single wire in order to simplify explanation, it actually includes a first control signal line 11, a second control signal line 12, a third control signal line 13, and a fourth control signal line 14 as illustrated in more detail in FIG. 2. First control signals Sc1[1]-Sc1[M] are supplied from the scanning line driving circuit 100 to the first control signal lines 11 of respective rows. These first control signals Sc1[1]-Sc1[M] specify respective time periods for taking the data voltage Vdata into the pixel circuits 400. Second control signals Sc2[1]-Sc2[M] are supplied from the scanning line driving circuit 100 to the second control signal lines 12 of respective rows. These second control signals Sc2[1]-Sc2[M] specify respective time periods for compensating the pixel circuits 400. Third control signals Sc3[1]-Sc3[M] are supplied from the scanning line driving circuit 100 to the third control signal lines 13 of respective rows. These third control signals Sc3[1]-Sc3[M] specify respective time periods for initializing the pixel circuits 400. Fourth control signals Sc4[1]-Sc4[M] are supplied from the scanning line driving circuit 100 to the fourth control signal lines 14 of respective rows. These fourth control signals Sc4[1]-Sc4[M] specify respective light-emitting time periods of the pixel circuits 400.

The pixel circuit 400 is further provided with an n-channel type transistor Tr1, transistor Tr2, transistor Tr3, and transistor Tr4. The gate electrode of the transistor Tr1 is connected to the first control signal line 11 through which the first control signal Sc1[i] is supplied. The gate electrode of the transistor Tr2 is connected to the second control signal line 12 through which the second control signal Sc2[i] is supplied. The gate electrode of the transistor Tr3 is connected to the third control signal line 13 through which the third control signal Sc3[i] is supplied. The gate electrode of the transistor Tr4 is connected to the fourth control signal line 14 through which the fourth control signal Sc4[i] is supplied.

The light-emitting control transistor Tr4 is provided as a switching element that controls whether a driving current should be supplied from the driving transistor Tdr to the OLED element 420 or not. The light-emitting control transistor Tr4 is configured as an n-channel type transistor, the drain electrode of which is connected to the positive pole of the OLED element 420, whereas the source electrode thereof is connected to the drain electrode of the driving transistor Tdr. The gate electrode of the light-emitting control transistor Tr4 is connected to the fourth control signal line 14. Therefore, the light-emitting control transistor Tr4 turns ON if the fourth control signal Sc4[i] that is supplied through the fourth control signal line 14 is in a high level, whereas the transistor turns OFF if the signal is in a low level.

The first transistor Tr1 is configured as an n-channel type transistor, the source electrode of which is connected to the data line 103 and the drain electrode of which is connected to a second electrode L1b of a capacitative element C1. The transistor Tr1 functions as a switching element that switches conduction (i.e., continuity)/non-conduction between the capacitative element C1 and the data line 103. The gate electrode of the transistor Tr1 is connected to the first control signal line 11. Therefore, the first transistor Tr1 turns ON if the first control signal Sc1[i] is in a high level, whereas the transistor turns OFF if the signal is in a low level. The voltage Vdata of the data line 103 is supplied to the second electrode L1b of the capacitative element C1 when the transistor Tr1 is in an ON state.

The second transistor Tr2 is provided for compensation of the driving transistor Tdr. The transistor Tr2 is configured as an n-channel type transistor, the drain electrode of which is connected to the drain electrode of the driving transistor Tdr and the source electrode of which is connected to the gate electrode of the driving transistor Tdr. The gate electrode of the transistor Tr2 is connected to the second control signal line 12. Therefore, the second transistor Tr2 turns ON if the second control signal Sc2[i] is in a high level, whereas the transistor turns OFF if the signal is in a low level. When the transistor Tr2 transitions into an ON state, the driving transistor Tdr starts to function as a diode with conductivity established between the gate electrode and the source electrode thereof.

The capacitative element C1 is provided to hold a voltage in accordance with a gradation signal. The capacitative element C1 functions as a capacitance that holds (i.e., accumulates) an electric charge between a first electrode L1a and a second electrode L1b thereof. The first electrode L1a of the capacitative element C1 is connected to the gate electrode of the driving transistor Tdr. The second electrode L1b of the capacitative element C1 is connected to the drain electrode of the first transistor Tr1. The capacitative element C2 is provided to hold a voltage for compensation of the driving transistor Tdr. The capacitative element C2 functions as a capacitance that holds an electric charge between a first electrode L2a and a second electrode L2b thereof. The first electrode L2a of the capacitative element C2 is connected to the gate electrode of the driving transistor Tdr. The second electrode L2b of the capacitative element C2 is connected to the power line 31.

The third transistor Tr3 is configured as an n-channel type transistor provided for initialization. The drain electrode of the transistor Tr3 is connected to the initialization power line 33. The source electrode of the transistor Tr3 is connected to the second electrode L1b of the capacitative element C1. The gate electrode of the transistor Tr3 is connected to the third control signal line 13. Therefore, the third transistor Tr3 turns ON if the third control signal Sc3[i] is in a high level, whereas the transistor turns OFF if the signal is in a low level.

B: Operation of Electro-Optical Device

Figure 3:
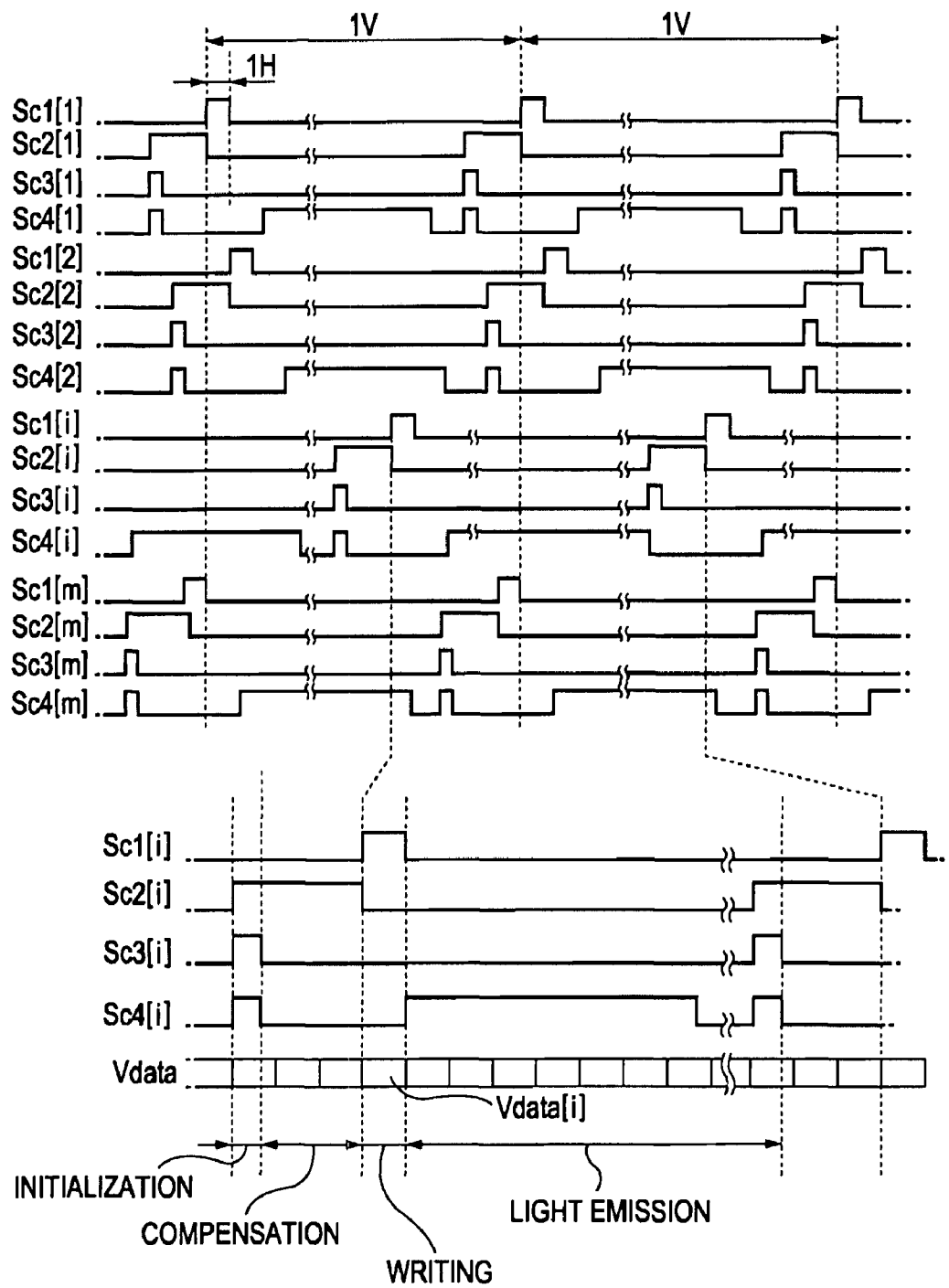
FIG. 3 is a timing chart that schematically illustrates an example of the waveform of each signal.

FIG. 3 is a timing chart that illustrates the waveform of each signal supplied to the pixel circuits 400. As illustrated in FIG. 3, the first control signals Sc1[1]-Sc1[M] turn to a high level in a sequential manner during a vertical scanning period (1V), where such a sequential level-switching is performed such that only one of the first control signals Sc1[1]-Sc1[M] is at a high level for each of predetermined horizontal scanning periods (1H). The pixel circuits 400 aligned to constitute each row are driven in the operation steps of initialization, compensation, writing, and light emission. First of all, in the initializing operation step, the scanning line driving circuit 100 sets the first control signal of the i-th row, Sc1[i], at a low level while setting the second, third, and fourth control signals of the i-th row, Sc2[i], Sc3[i], and Sc4[i], at a high level. Under this setting, the first transistor Trn is put in an OFF state, while the second, third, and fourth transistors Tr2, Tr3, and Tr4 are put in an ON state. When these transistors are set as described above, the initialization voltage VST (for example, a low voltage/potential) of the initialization power line 33 is supplied to the second electrode L1b of the capacitative element C1, while the first electrode L1a thereof is connected to the OLED element 420 via the second, third, and fourth transistors Tr2, Tr3, and Tr4. Such a connection causes the voltage/potential held at both ends of the capacitative element C1 to be initialized so as to discharge the electric charge accumulated at the capacitative element C1.

Subsequently, in the compensating operation step, the scanning line driving circuit 100 sets the second control signal of the i-th row, Sc2[i], at a high level while setting the first, third, and fourth control signals of the i-th row, Sc1[i], Sc3[i], and Sc4[i], at a low level. Under this setting, the second transistor Tr2 is put in an ON state, while the first, third, and fourth transistors Tr1, Tr3, and Tr4 are put in an OFF state. When these transistors are set in such an ON/OFF state, the voltage VG of the gate electrode of the driving transistor Tdr converges into "Vdd-Vth" so as to cause the capacitative element C2 to hold a voltage of "-Vth". Herein, the symbol "Vth" denotes a threshold value of the driving transistor Tdr.

Thereafter, in the writing operation step, the data line driving circuit 200 supplies a write-in voltage Vdata to each of the designated data lines 103 in accordance with instructions given from the control circuit 300, whereas the scanning line driving circuit 100 sets the first control signal of the i-th row, Sc1[i], at a high level while setting the second, third, and fourth control signals of the i-th row, Sc2[i], Sc3[i], and Sc4[i], at a low level. Under this setting, the first transistor Tr1 is put in an ON state, while the second, third, and fourth transistors Tr2, Tr3, and Tr4 are put in an OFF state. When these transistors are set in such an ON/OFF state, the voltage Vdata of the data line 103 is supplied to the second electrode L1b of the first capacitative element C1. Accordingly, the voltage of the second electrode L1b of the first capacitative element C1 changes from the initialization voltage VST set in the initializing operation step to the data voltage Vdata. When the voltage of the second electrode L1b of the first capacitative element C1 changes by $\Delta V$ (where $\Delta V = VST - Vdata$), the voltage VG of the gate electrode of the driving transistor Tdr changes from the immediately previous voltage level, that is, Vdd-Vth, by the level amount calculated by dividing the voltage change $\Delta V$ that occurs at the second electrode L1b of the capacitative element C1 in proportion to the ratio of an electrostatic capacity (i.e., capacitance) Ca of the first capacitative element C1 to an electrostatic capacity Cb of the second capacitative element C2 due to a capacitative coupling between the first capacitative element C1 and the second capacitative element C2. Since the amount of the change in the voltage VG at the connection point NG is expressed as "ΔV·Ca/(Ca+Cb)", the voltage VG at the connection point NG after the writing operation is calculated by the following mathematical formula (1).

$$VG = Vdd - Vth - \Delta V \cdot Ca/(Ca+Cb) \quad (1)$$

After completion of the writing operation step, the scanning line driving circuit 100 sets the fourth control signal of the i-th row, Sc4[i], at a high level while setting the first, second, and third control signals of the i-th row, Sc1[i], Sc2[i], and Sc3[i], at a low level. Under this setting, the fourth transistor Tr4 is put in an ON state, while the first, second, and third transistors Tr1, Tr2, and Tr3 are put in an OFF state. When these transistors are set in such an ON/OFF state, a driving current "Iel", which corresponds to an inter-electrode voltage between the gate electrode and the source electrode of the driving transistor Tdr, flows at the OLED element 420. Since the voltage of the gate electrode of the driving transistor Tdr relative to the source electrode thereof is expressed as "−(VG−Vdd)", the driving current Iel is expressed by the following mathematical formula (2).

$$Iel = (1/2)\beta(Vdd - VG - Vth)^2 \quad (2)$$

If the mathematical equation (1) is substituted into the mathematical equation (2), the above mathematical equation (2) is deformed as the following mathematical formula (3).

$$Iel = (1/2)\beta(k \cdot \Delta V)^2 \quad (3)$$

In the above mathematical formula, the constant "k" denotes "Ca/(Ca+Cb)". As understood from the mathematical formula (3), it is a difference ΔV between the data voltage Vdata and the power voltage Vdd (=Vdd−Vdata) only that determines the driving current Iel that is supplied to the OLED element 420. This means that the driving current Iel does not depend on the threshold voltage Vth of the driving transistor Tdr. In other words, in this embodiment of the invention, likewise other embodiments thereof, it is possible to compensate for nonuniformity among the threshold voltages Vth of the driving transistors Tdr of the respective pixel circuits 400. Thus, it is further possible to cause the OLED element 420 to emit light with a desired luminance with a high precision.

C: Configuration of Capacitative Elements and Other Components

Figure 4:
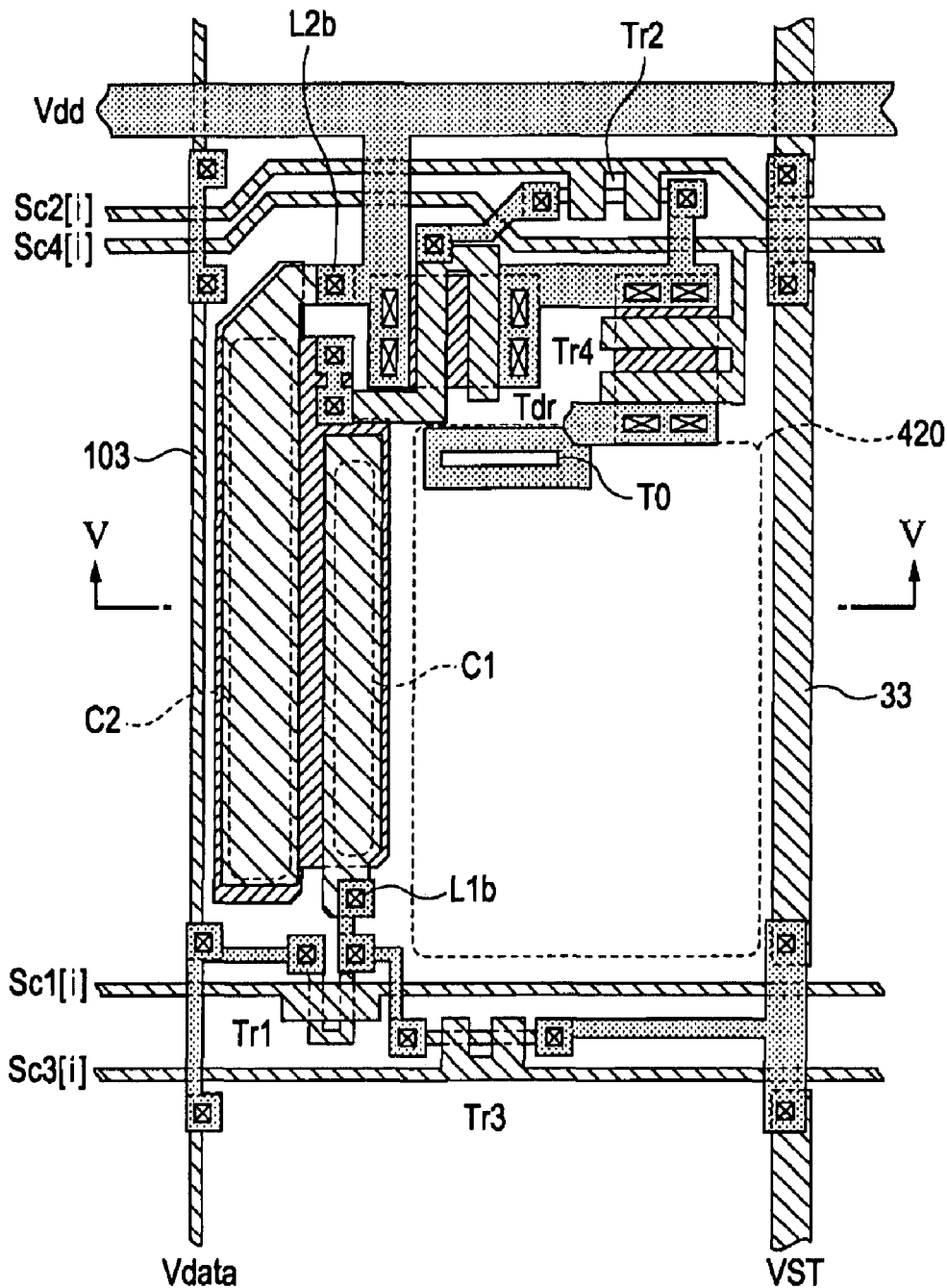
FIG. 4 is a plane view that conceptually illustrates the exemplary configuration of the substantial part of the electro-optical device according to the embodiment of the invention.
Figure 5:
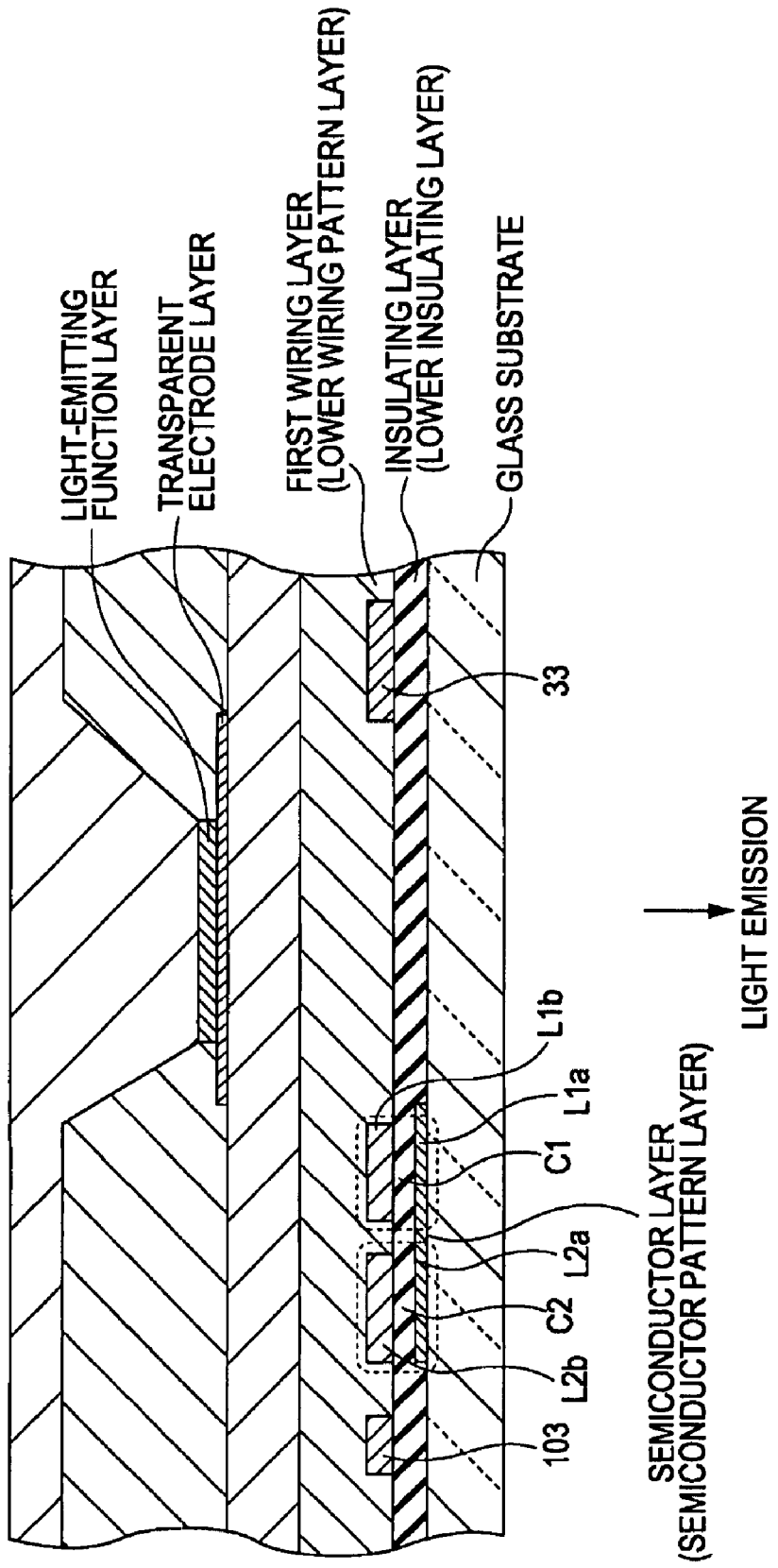
FIG. 5 is a sectional view that conceptually illustrates the exemplary configuration of the substantial part of the electro-optical device according to the embodiment of the invention.

FIG. 4 is a plane view that conceptually illustrates a close-up view of an electro-optical device having a configuration described above, which focuses on one pixel thereof. FIG. 5 is a sectional view taken along the line a-a' of FIG. 4. FIG. 4 illustrates a semiconductor layer, a gate wiring layer, and a source wiring layer only. However, as illustrated in FIG. 5, these layers are deposited on a substrate made of glass or the like. In addition, these layers are separated from one another by other interposed layer(s) provided therebetween. To simplify illustration, however, the glass substrate and the interposed layers are not shown in FIG. 4. In the description of this specification, the semiconductor layer is also referred to as a semiconductor pattern layer. The gate wiring layer, which corresponds to "a first wiring layer" in FIG. 4 and subsequent drawings, is also referred to as a lower wiring pattern layer herein. The source wiring layer, which corresponds to "a second wiring layer" in FIG. 4 and subsequent drawings, is also referred to as an upper wiring pattern layer herein. An insulating layer (also referred to as an upper insulating layer) is deposited on the source wiring layer (i.e., upper wiring pattern layer). The OLED element 420, which is connected to the source wiring layer via a terminal T0, is formed on the insulating layer (i.e., upper insulating layer). A common electrode (ground) is formed on the OLED element 420. It should be noted that these components are not shown in the drawing for simplicity.

Each of the transistors Tr1-Tr4 and the driving transistor Tdr are configured to include the semiconductor layer (i.e., semiconductor pattern layer) and the gate wiring layer (i.e., lower wiring pattern layer). A lower insulating layer is deposited between the gate wiring layer and the semiconductor layer. The capacitative element C1 and the capacitative element C2 are formed between the common electrode that is provided in the semiconductor layer (L1a, L2a) and the electrodes that are provided in the gate wiring layer (L1b, L2b). In an electro-optical device according to this embodiment of the invention, the capacitative element C2 is arranged between the capacitative element C1 and the data line 103.

The above-explained configuration according to the present embodiment of the invention is further described in detail below. The semiconductor pattern layer is deposited on a base surface such as a glass substrate surface or the like. The semiconductor pattern layer formed on the base surface includes a semiconductor film on which the channel region of each of the first, second, third, and fourth transistors Tr1, Tr2, Tr3, and Tr4 as well as the channel region of the driving transistor Tdr are formed, the first electrode L1a of the capacitative element C1, and the first electrode L2a of the capacitative element C2. The semiconductor film on which the channel regions are formed is separated from the first electrode L1a and the second electrode L2a by selectively performing impurity implantation on the semiconductor film that is formed over the entire region of the base surface, and then by carrying out patterning processing thereon. Although the electrical conductivity of the first electrode L1a of the capacitative element C1 and the first electrode L2a of the capacitative element C2 is higher than that of the semiconductor film on which the channel regions are formed after the selective impurity implantation, in the present embodiment of the invention, the first electrode L1a of the capacitative element C1 and the first electrode L2a of the capacitative element C2 are defined as a part of the "semiconductor layer", that is, "semiconductor pattern layer".

The lower insulating layer covers the semiconductor pattern layer. The lower wiring pattern layer is formed on the lower insulating layer. The lower wiring pattern layer includes the data line 103, the second electrode L1b of the capacitative element C1, the second electrode L2b of the capacitative element C2, and the initialization power line 33. The upper insulating layer covers the lower wiring pattern layer.

The reason why the invention adopts a layer structure described above is as follows. The data voltage Vdata, which is to be written into the pixel circuits 400 aligned to constitute a row, is supplied to the data line 103 at intervals of one horizontal scanning period (1H). Therefore, the voltage/potential of the data line 103 varies from one horizontal scanning period H to another. Since the first transistor Tr1 is in an OFF state for each of the rows that are not currently selected, in a theoretical sense, ideally, the voltage/potential of the second electrode L1b of the capacitative element C1 does not change. However, in a practical layout, parasitic capacitance exists/occurs between the second electrode L1b of the capacitative element C1 and the data line 103. For this reason, the voltage/potential of the second electrode L1b of the capacitative element C1 changes because of a capacitative coupling formed between the second electrode L1b of the capacitative element C1 and the data line 103 via the parasitic capacitance. In order to avoid the possible change in the voltage/potential of the second electrode L1b of the capacitative element C1, it is important to reduce the parasitic capacitance. If a distance between the first capacitative element C1 and the data line 103 is shorter than that between the second capacitative element C2 and the data line 103, a larger parasitic capacitance occurs, which disadvantageously changes the voltage/potential of the second electrode L1b of the capacitative element C1 with a larger fluctuation. In order to avoid such a problem, according to the invention, the second capacitative element C2 is provided between the first capacitative element C1 and the data line 103 so as to make the distance between the first capacitative element C1 and the data line 103 longer.

The above-described layout makes it possible to reduce the parasitic capacitance to decrease a crosstalk between the first capacitative element C1 and the data line 103. By this means, the invention makes it possible to reduce the change in the gate voltage/potential of the driving transistor Tdr caused by a fluctuation (i.e., change) in the voltage/potential of the first capacitative element C1, which results in an enhanced display quality. As illustrated in FIG. 5, which is a sectional view taken along the line a-a', of FIG. 4, in the present embodiment of the invention, the data line 103, the second electrode L1b of the first capacitative element C1, and the second electrode L2b of the second capacitative element C2 are provided in the first wiring layer, whereas the first electrode L1a of the first capacitative element C1 and the first electrode L2a of the second capacitative element C2 are provided in the semiconductor layer. As described above, it is preferable that the first electrode L1a of the first capacitative element C1 and the first electrode L2a of the second capacitative element C2 are formed in a layer that is not the same as one in which the data line 103 is formed. Herein, the first electrode L1a of the first capacitative element C1 is connected to the power line 31 through which the power voltage Vdd is supplied. Accordingly, the power voltage Vdd is supplied to the first electrode L1a of the first capacitative element C1. Notwithstanding the above, however, the first electrode L1a of the first capacitative element C1 may be connected to any other line to which a fixed voltage/potential is supplied. In the present embodiment of the invention, the first electrode L1a of the first capacitative element C1 and the first electrode L2a of the second capacitative element C2 are configured as the common electrode provided in the semiconductor layer. Therefore, as another advantage, the present embodiment of the invention achieves a smaller layout area, which contributes to a higher degree of integration. In addition, the second electrode L1b of the first capacitative element C1, the second electrode L2b of the second capacitative element C2, the data line 103, and the initialization power line 33 are formed on a single surface of the first wiring layer. Therefore, as still another advantage, the present embodiment of the invention smoothens a transparent electrode layer to improve the flatness of a light-emitting function layer. Thus, it is possible to enhance display quality.

D: Variations

Various kinds of changes, modifications, adaptations, variations, improvements, or the like may be made on the specific examples of the exemplary embodiment of the invention described above.

Figure 7:
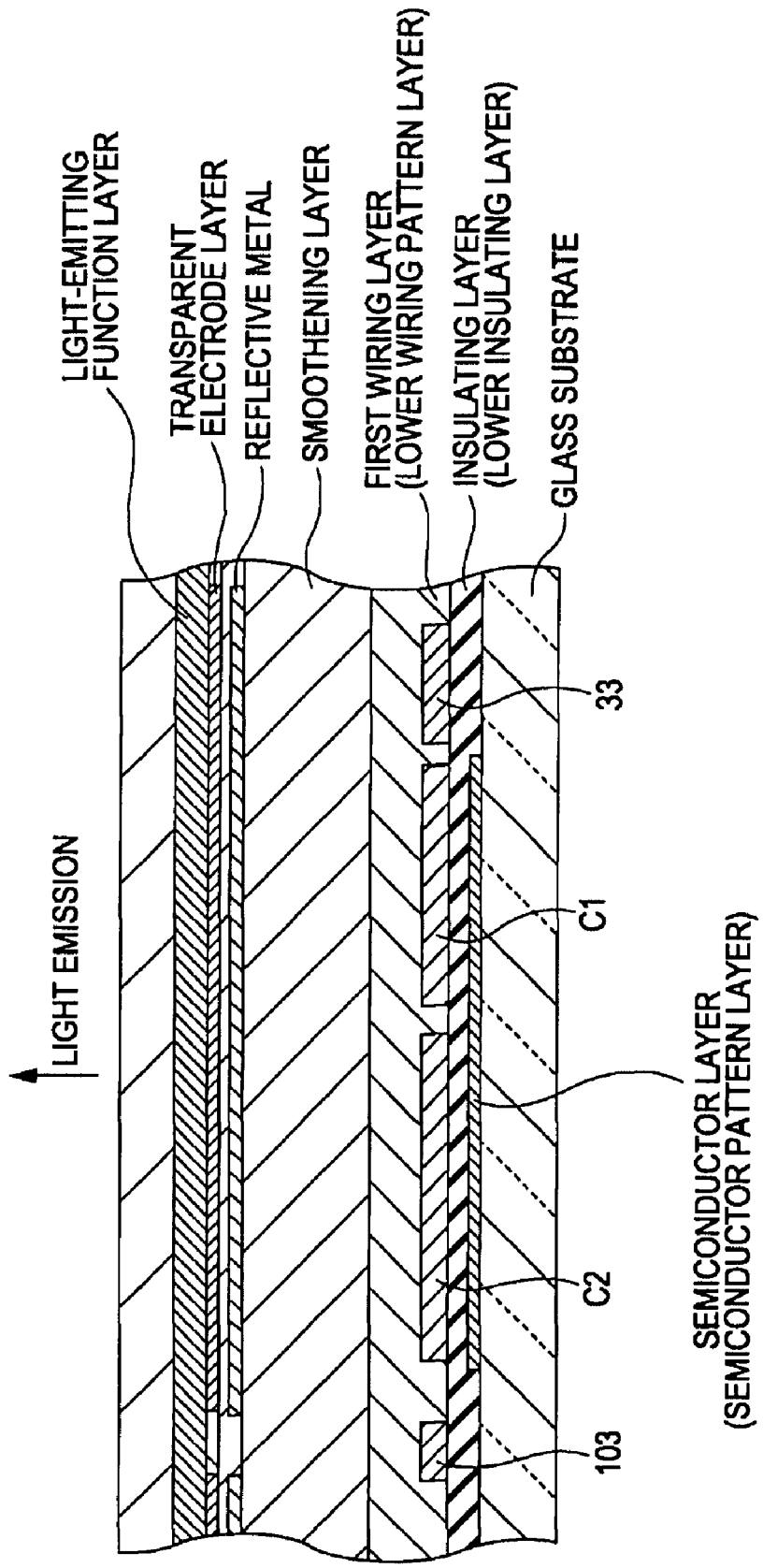
FIG. 7 is a sectional view that conceptually illustrates the exemplary configuration of the substantial part of the electro-optical device according to the variation example of the invention.

(1) In the exemplary embodiment described above, as illustrated in FIGS. 4 and 5, the OLED element 420 is explained to have a bottom-emission type structure. However, the OLED element 420 may be alternatively configured as a top-emission type one. An example of a top-emission type OLED element is illustrated in FIGS. 6 and 7. In the top-emission type OLED element 420 illustrated in FIG. 7, light is emitted upward. Accordingly, the top-emission type OLED element 420 is provided with a reflective metal so as to reflect light that is emitted downward from the light-emitting function layer. In the configuration of the top-emission type OLED element 420, it is possible to provide circuit elements at an area under the OLED element 420. In the illustrated example, the first capacitative element C1 and the second capacitative element C2 are arranged thereat.

As illustrated in FIG. 6, when viewed along the X direction, the data line 103, the second capacitative element C2, the first capacitative element C1, and the initialization power line 33 are arranged in the order of appearance herein (that is, in the cyclic order of "the data line 103→the second capacitative element C2→the first capacitative element C1→the initialization power line 33→(and again) the data line 103, - - - "). In the top-emission type OLED element 420, it is possible to array the first capacitative element C1 at an area over which the OLED element 420 is formed in an overlapping manner. For this reason, a distance between the first capacitative element C1 of the pixel circuit 400 (that is discussed above while focusing on one pixel) and the data line 103b of an adjacent pixel circuit 400 is relatively short, although the first capacitative element C1 of the first-mentioned pixel circuit 400 is distanced away from the data line 103a thereof with the second capacitative element C2 thereof interposed therebetween. Although the distance between the first capacitative element C1 and the data line 103b is relatively short, the initialization power line 33 is arranged therebetween. Since a fixed initialization voltage (i.e., potential) VST is supplied to the initialization power line 33, it is possible to reduce parasitic capacitance between the first capacitative element C1 and the data line 103b. Therefore, it is possible to decrease a crosstalk between the first capacitative element C1 and the data line 103b of the adjacent pixel circuit 400 so as to improve the quality of displayed images. Moreover, it is further possible to increase an aperture ratio so as to display high-resolution images because the OLED element 420 and other various kinds of circuit elements can be formed in a three-dimensional layout.

Figure 8:
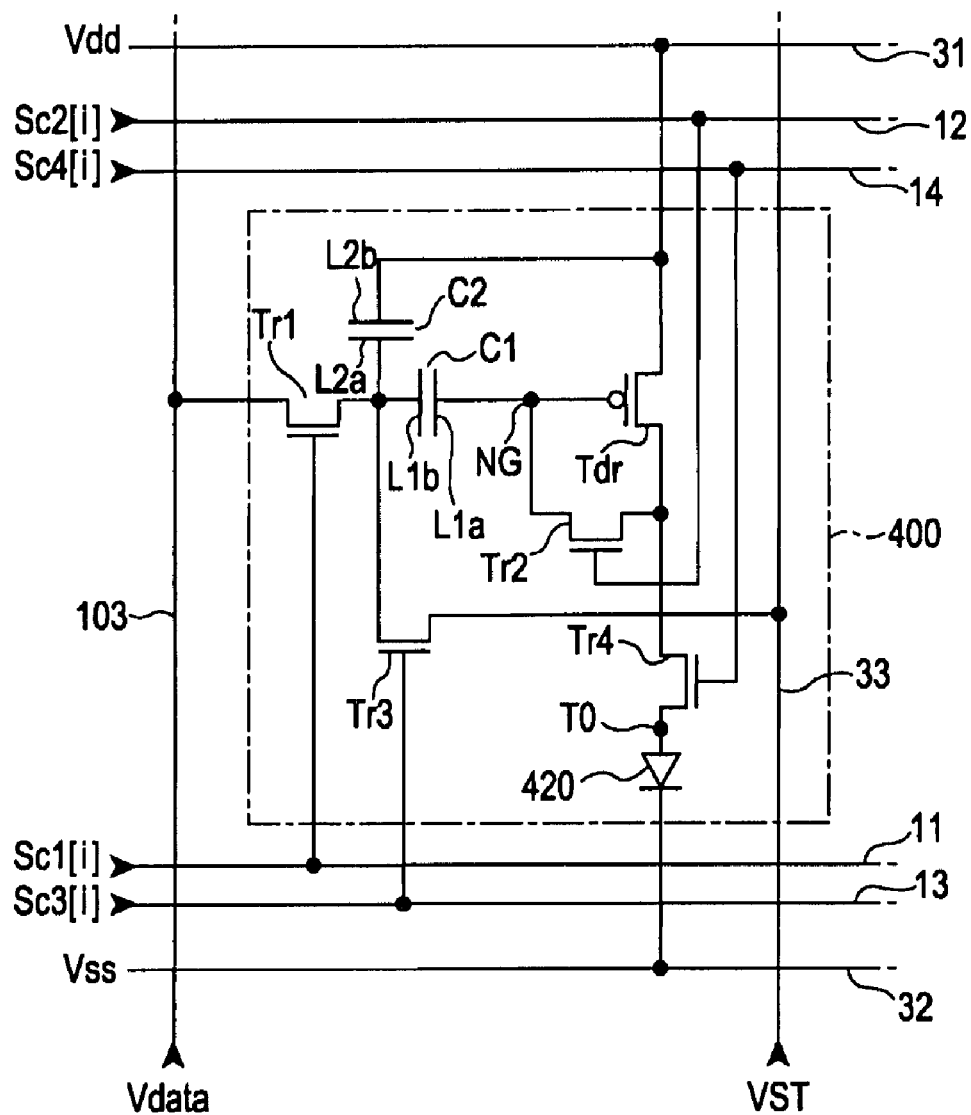
FIG. 8 is a circuit diagram that schematically illustrates an example of the configuration of a pixel circuit according to a variation example of the invention.

(2) In the exemplary embodiment described above, the first electrode L2a of the second capacitative element C2 (third electrode) is electrically connected to the first electrode L1a of the first capacitative element C1 (first electrode). However, as illustrated in FIG. 8, the first electrode L2a of the second capacitative element C2 (third electrode) may be electrically connected to the second electrode L1b of the first capacitative element C1 (second electrode).

Figure 9:
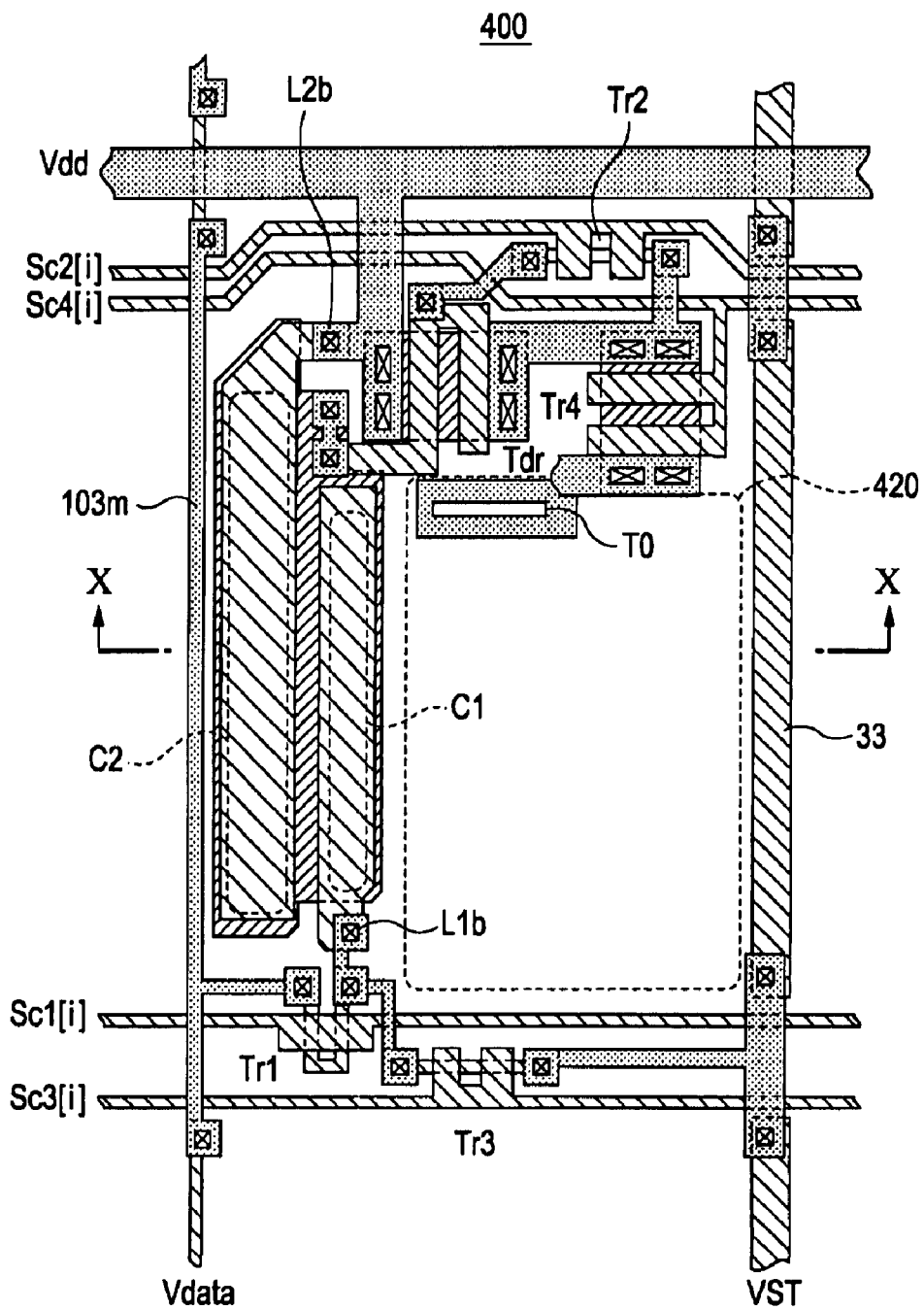
FIG. 9 is a plane view that conceptually illustrates the exemplary configuration of the substantial part of the electro-optical device according to a variation example of the invention.
Figure 10:
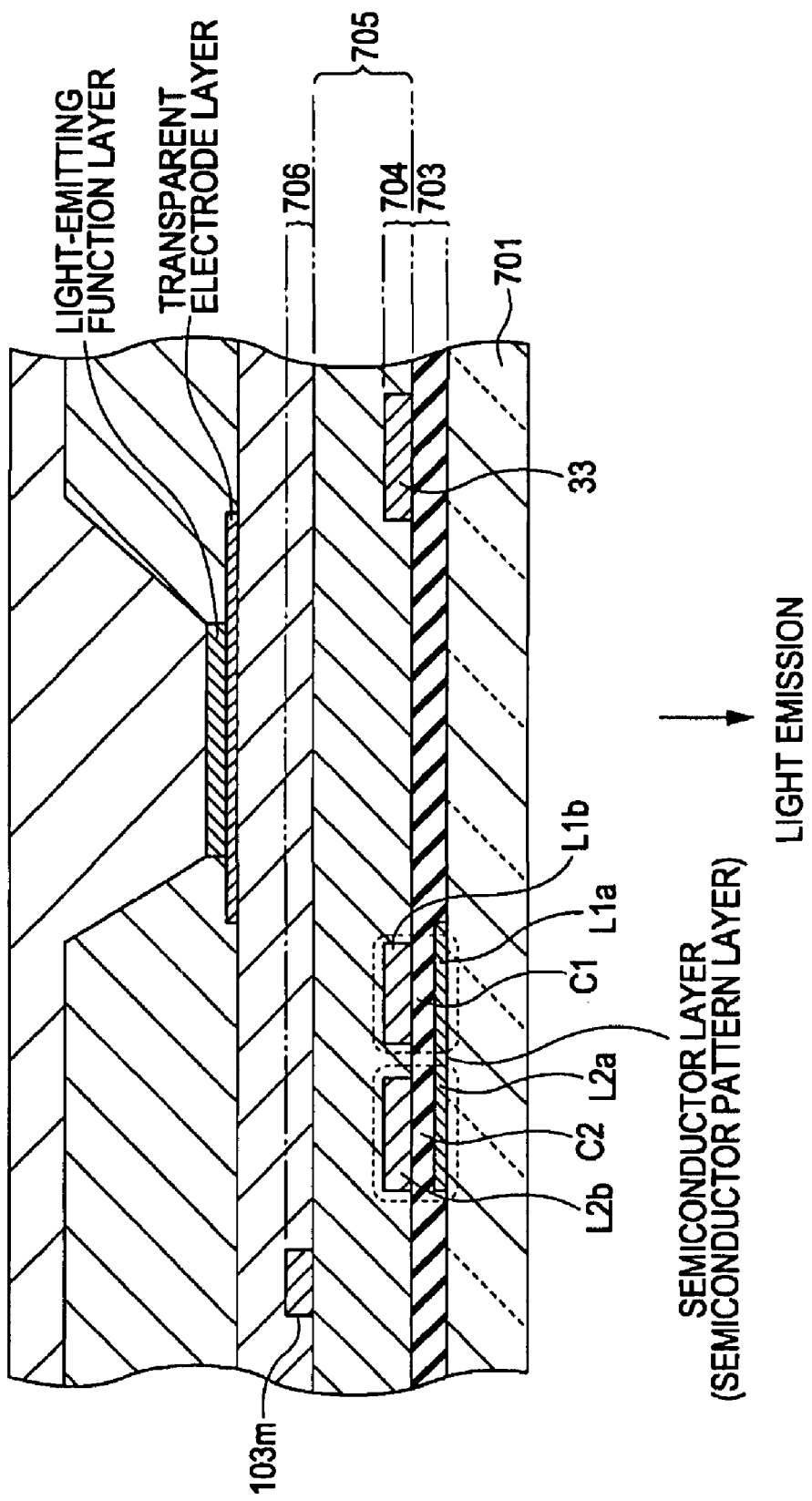
FIG. 10 is a sectional view that conceptually illustrates the exemplary configuration of the substantial part of the electro-optical device according to the variation example of the invention.

(3) In the exemplary embodiment described above, the data line 103 is formed in the lower wiring pattern layer that is deposited on the lower insulating layer. However, as illustrated in FIGS. 9 and 10, a data line 103m may be formed in an upper wiring pattern layer 706, which is deposited on an upper insulating layer 705 covering a lower wiring pattern layer 704.

(4) In the configuration illustrated in FIGS. 4-7, the first electrode L2a of the second capacitative element C2 (third electrode) is electrically connected to the gate electrode of the driving transistor Tdr. In such a configuration, the first electrode L1a of the first capacitative element C1 (first electrode) and the first electrode L2a of the second capacitative element C2 (third electrode) are formed on (i.e., constituted by) the common semiconductor film in the semiconductor pattern layer. With such a configuration, it is possible to distance the common semiconductor film away from the data line 103 in a three-dimensional layout because the data line 103 is formed on the lower insulating layer covering the semiconductor pattern layer. Therefore, it is further possible to reduce a coupling capacitance between the common semiconductor film and the data line 103.

Figure 11A:
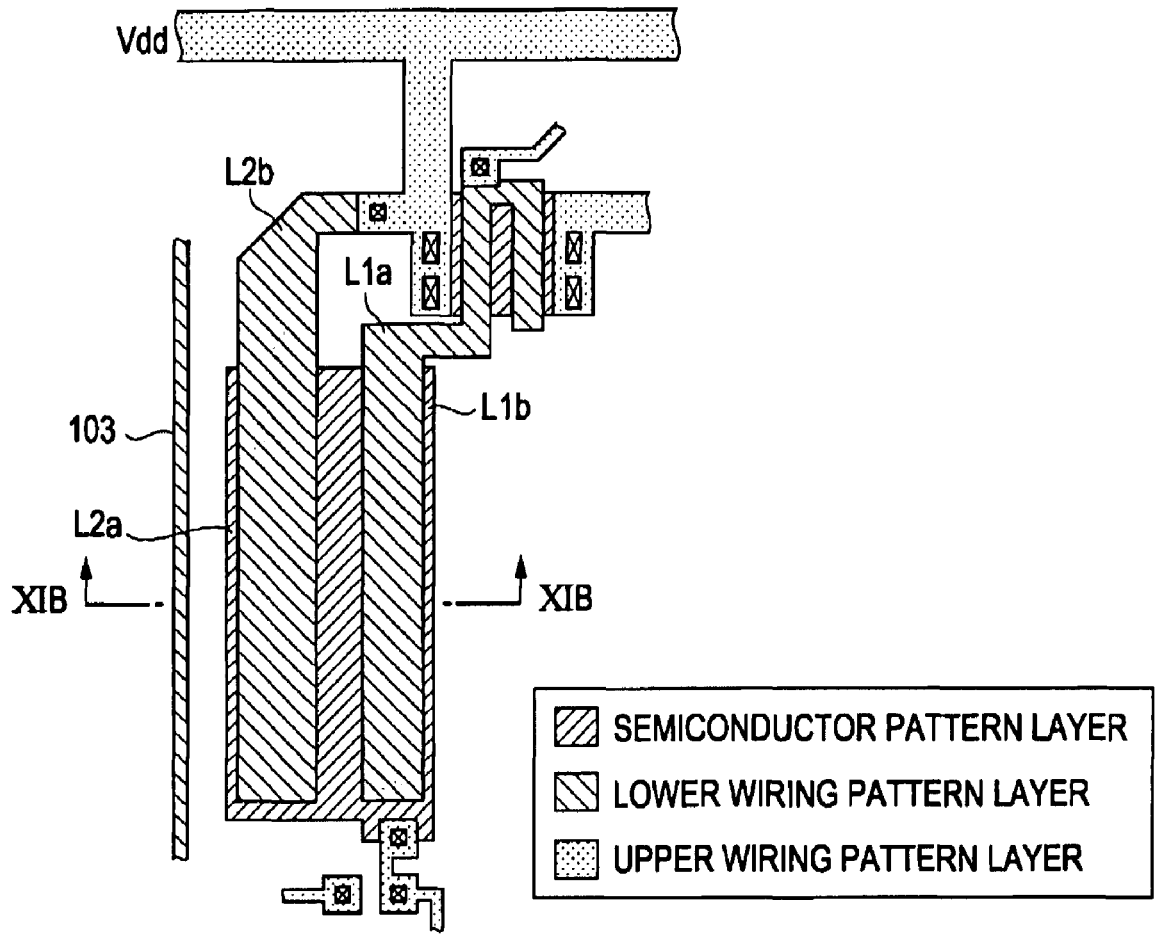
FIGS. 11A and 11B is a set of a plane view and a sectional view that conceptually illustrates the exemplary configuration of the substantial part of the electro-optical device according to a variation example of the invention.
Figure 11B:
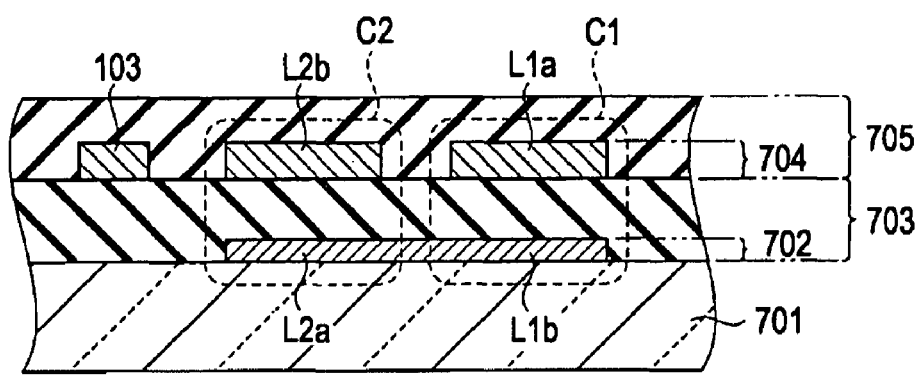

On the other hand, as illustrated in FIGS. 11A and 11B, when the first electrode L2a of the second capacitative element C2 (third electrode) is electrically connected to the second electrode L1b of the first capacitative element C1 (second electrode), the first electrode L2a of the second capacitative element C2 (third electrode) and the second electrode L1b of the first capacitative element C1 (second electrode) may be formed on the common semiconductor film. In such a configuration, specifically, a semiconductor pattern layer 702 is formed on a base surface such as the face of a glass substrate 701. The semiconductor pattern layer 702 includes a semiconductor film on which the channel region of the driving transistor Tdr is formed (not shown in the drawing), the second electrode L1b of the first capacitative element C1 (second electrode), and the first electrode L2a of the second capacitative element C2 (third electrode). The lower insulating layer 703 covers the semiconductor pattern layer 702. The lower wiring pattern layer 704, which has the first electrode L1a of the first capacitative element C1 (first electrode) and the second electrode L2b of the second capacitative element C2 (fourth electrode), is deposited on the lower insulating layer 703. In this variation example, the lower wiring pattern layer 704 further includes the data line 103. The upper insulating layer 705 covers the lower wiring pattern layer 704.

In such a configuration, the first electrode L1a of the first capacitative element C1 (first electrode), the second electrode L2b of the second capacitative element C2 (fourth electrode), and the data line 103 are formed in the common lower wiring pattern layer 704. In addition, since the second electrode L2b of the second capacitative element C2 (fourth electrode) is interposed between the first electrode L1a of the first capacitative element C1 (first electrode) and the data line 103, it is possible to reduce a coupling capacitance therebetween. It is preferable that the second electrode L2b of the second capacitative element C2 (fourth electrode) is connected to a line having a constant potential. For example, the second electrode L2b of the second capacitative element C2 is preferably connected to the power line 31.

Figure 12A:
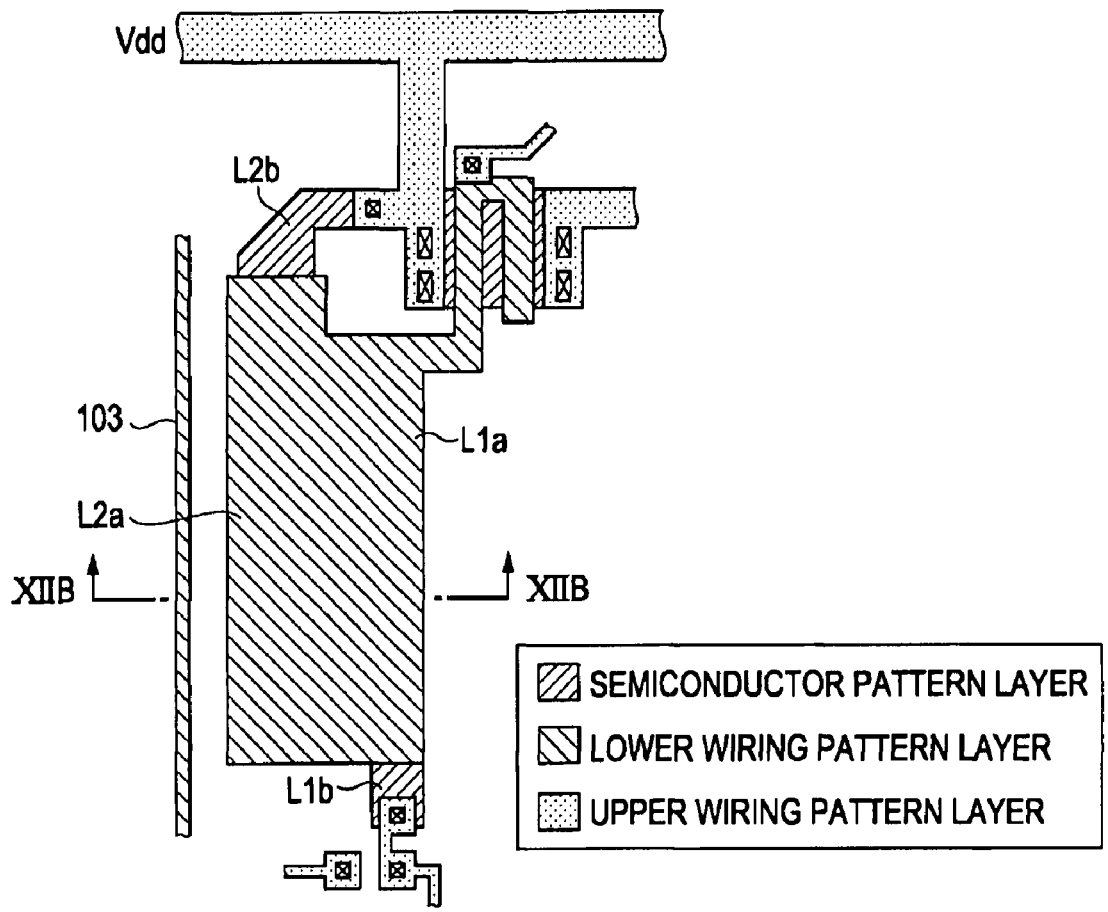
FIGS. 12A and 12B is a set of a plane view and a sectional view that conceptually illustrates the exemplary configuration of the substantial part of the electro-optical device according to a variation example of the invention.
Figure 12B:
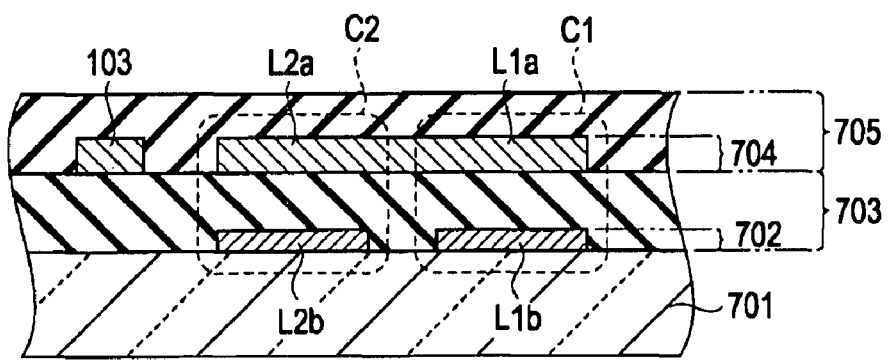

As illustrated in FIGS. 12A and 12B, when the first electrode L2a of the second capacitative element C2 (third electrode) is electrically connected to the gate electrode of the driving transistor Tdr, the first electrode L1a of the first capacitative element C1 (first electrode), the first electrode L2a of the second capacitative element C2 (third electrode), and the data line 103 may be formed in the lower wiring pattern layer 704, which is deposited on the lower insulating layer 703. In addition, the first electrode L1a of the first capacitative element C1 (first electrode) and the first electrode L2a of the second capacitative element C2 (third electrode) may be formed on (i.e., constituted by) the common electrode film.

In such a configuration, specifically, the semiconductor pattern layer 702 is formed on a base surface such as the face of the glass substrate 701. The semiconductor pattern layer 702 includes a semiconductor film on which the channel region of the driving transistor Tdr is formed (not shown in the drawing), the second electrode L1b of the first capacitative element C1 (second electrode), and the second electrode L2b of the second capacitative element C2 (fourth electrode). The lower insulating layer 703 covers the semiconductor pattern layer 702. The lower wiring pattern layer 704, which has the first electrode L1a of the first capacitative element C1 (first electrode) and the first electrode L2a of the second capacitative element C2 (third electrode), is deposited on the lower insulating layer 703. In the configuration of the lower wiring pattern layer 704, the first electrode L1a of the first capacitative element C1 (first electrode) and the first electrode L2a of the second capacitative element C2 (third electrode) are formed on (i.e., constituted by) the common electrode film. Likewise other variation examples described above, also in this variation example, the lower wiring pattern layer 704 further includes the data line 103. The upper insulating layer 705 covers the lower wiring pattern layer 704.

If the above-described configuration is applied to a top-emission type OLED element, there is no need to perform patterning on the lower wiring pattern layer 704 between the first electrode L1a of the first capacitative element C1 (first electrode) and the first electrode L2a of the second capacitative element C2 (third electrode), which is an advantageous difference from the example illustrated in FIG. 7. The thickness of a film included in the semiconductor pattern layer 702 is, for example, approximately 100 nm, whereas the thickness of a film included in the lower wiring pattern layer 704 is approximately 500 nm. Generally speaking, the thickness of a wiring pattern is larger than that of the semiconductor pattern. Therefore, in comparison with a case where the lower wiring pattern layer 704 is subjected to patterning, it is possible to reduce surface unevenness at a greater degree if the semiconductor pattern layer 702 is patterned between the first capacitative element C1 and the second capacitative element C2. Therefore, with the above-described structure, it is possible to smoothen the surface of a light-emitting device.

Figure 13A:
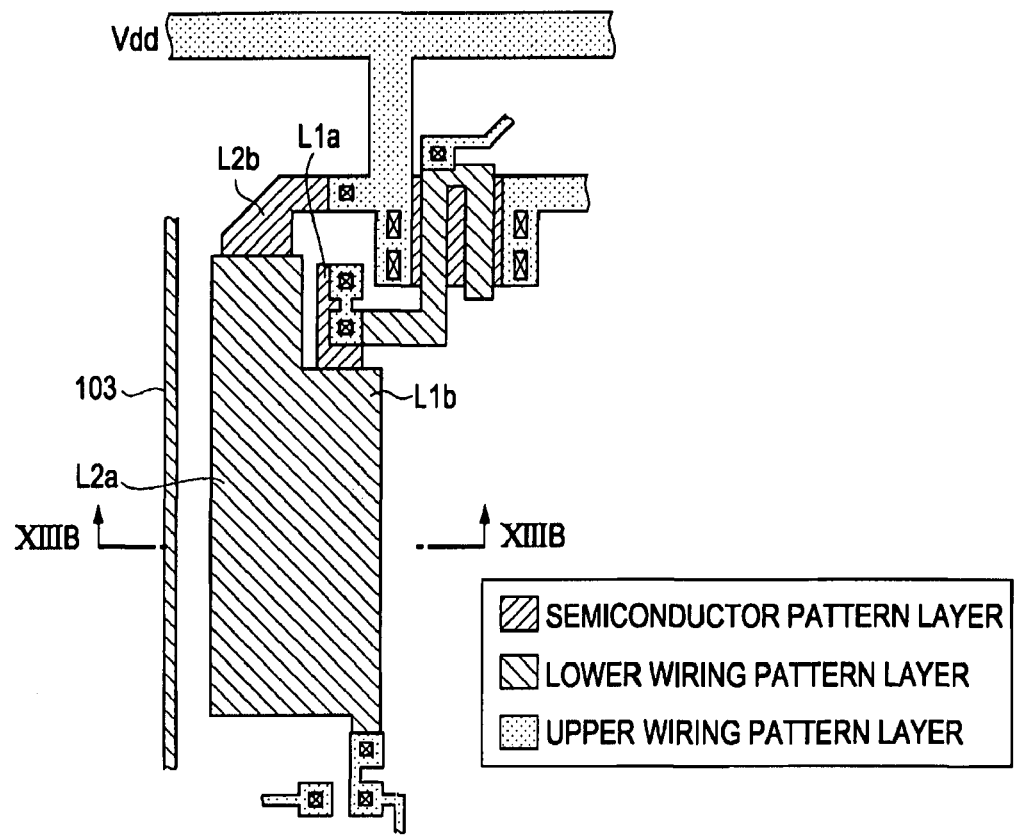
FIGS. 13A and 13B is a set of a plane view and a sectional view that conceptually illustrates the exemplary configuration of the substantial part of the electro-optical device according to a variation example of the invention.
Figure 13B:
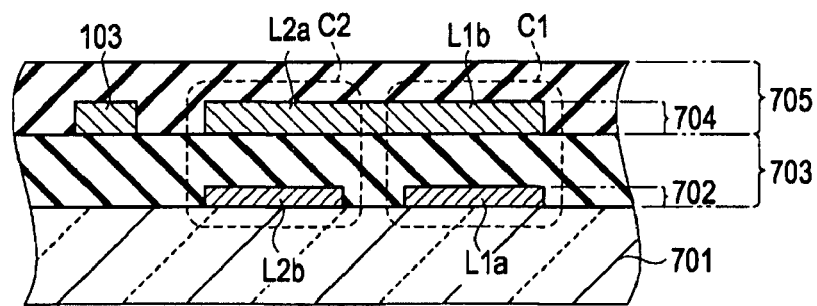

As illustrated in FIGS. 13A and 13B, when the first electrode L2a of the second capacitative element C2 (third electrode) is electrically connected to the second electrode L1b of the first capacitative element C1 (second electrode), the first electrode L2a of the second capacitative element C2 (third electrode) and the second electrode L1b of the first capacitative element C1 (second electrode) may be formed in the lower wiring pattern layer 704, which is deposited on the lower insulating layer 703.

In such a configuration, specifically, the semiconductor pattern layer 702 is formed on a base surface such as the face of the glass substrate 701. The semiconductor pattern layer 702 includes a semiconductor film on which the channel region of the driving transistor Tdr is formed (not shown in the drawing), the first electrode L1a of the first capacitative element C1 (first electrode), and the second electrode L2b of the second capacitative element C2 (fourth electrode). The lower insulating layer 703 covers the semiconductor pattern layer 702. The lower wiring pattern layer 704, which has the second electrode L1b of the first capacitative element C1 (second electrode) and the first electrode L2a of the second capacitative element C2 (third electrode), is deposited on the lower insulating layer 703. In the configuration of the lower wiring pattern layer 704, the second electrode L1b of the first capacitative element C1 (second electrode) and the first electrode L2a of the second capacitative element C2 (third electrode) are formed on (i.e., constituted by) the common electrode film. The upper insulating layer 705 covers the lower wiring pattern layer 704.

With such a configuration, likewise the aforementioned example, there is no need to perform patterning on the lower wiring pattern layer 704 between the second electrode L1b of the first capacitative element C1 (second electrode) and the first electrode L2a of the second capacitative element C2 (third electrode). Thus, likewise the aforementioned example, it is possible to reduce surface unevenness between the first capacitative element C1 and the second capacitative element C2.

(5) The conductivity type of each of transistors that make up the pixel circuit 400 may be changed if necessary. For example, the driving transistor Tdr illustrated in FIG. 2 may be configured as an n-channel type one. Even when the driving transistor Tdr illustrated in FIG. 2 is configured as an n-channel type one, the voltage Vdd that is supplied to the power line 31 is set at a potential which turns the driving transistor Tdr ON when it is supplied to the gate electrode thereof.

It should be noted that, in the exemplary embodiment and variations described above, the surface of a substrate such as the glass substrate 701 may be covered by a protective film. Even when a protective film covers the surface of a substrate, in the description of this specification as well as its interpretation, the base substrate underlying the protective film and the overlying protective film is collectively referred to as "a substrate".

E: Application Examples

Figure 14:
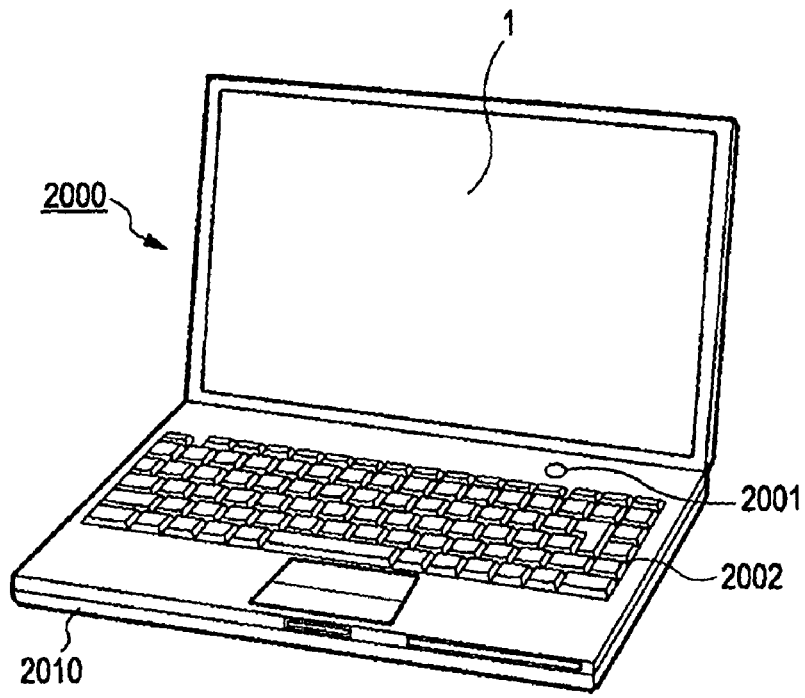
FIG. 14 is a perspective view that schematically illustrates a specific example of an electronic apparatus according to the embodiment of the invention.

Next, an example of various kinds of electronic apparatuses that have the electro-optical device 1 is explained below. FIG. 14 is a perspective view that schematically illustrates an example of the configuration of a mobile personal computer that adopts, as a display device thereof, the electro-optical device 1 according to any of the exemplary embodiments, including variation examples thereof, described above. A personal computer 2000 has the electro-optical device 1, which functions as the display device thereof, and a main assembly 2010. The main assembly 2010 is provided with a power switch 2001 and a keyboard 2002. Since an OLED element is used in the electro-optical device 1 as an electro-optical element thereof, the personal computer 2000 is capable of providing an easily viewable eye-friendly display featuring a wide angle of visibility.

Figure 15:
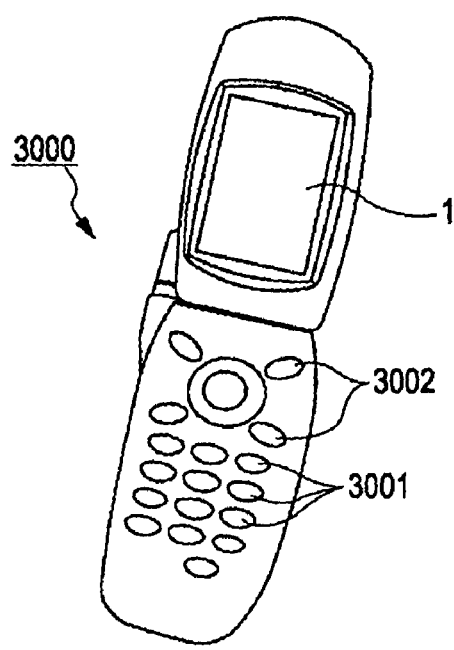
FIG. 15 is a perspective view that schematically illustrates a specific example of an electronic apparatus according to the embodiment of the invention.

FIG. 15 illustrates an example of the configuration of a mobile phone that adopts the electro-optical device 1 according to any of the exemplary embodiments, including variation examples thereof, described above. A mobile phone 3000 is provided with a plurality of manual operation buttons 3000, scroll buttons 3002, and the electro-optical device 1 functioning as a display device thereof. As a user manipulates the scroll buttons 3002, the content displayed on the screen of the electro-optical device 1 is scrolled.

Figure 16:
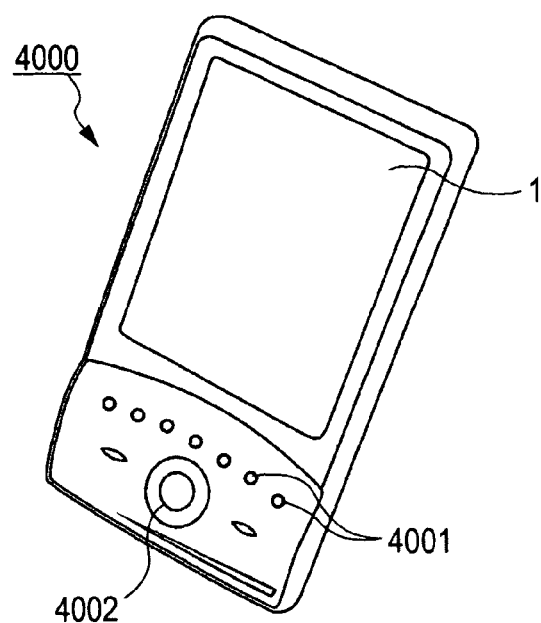
FIG. 16 is a perspective view that schematically illustrates a specific example of an electronic apparatus according to the embodiment of the invention.
Figure 17:
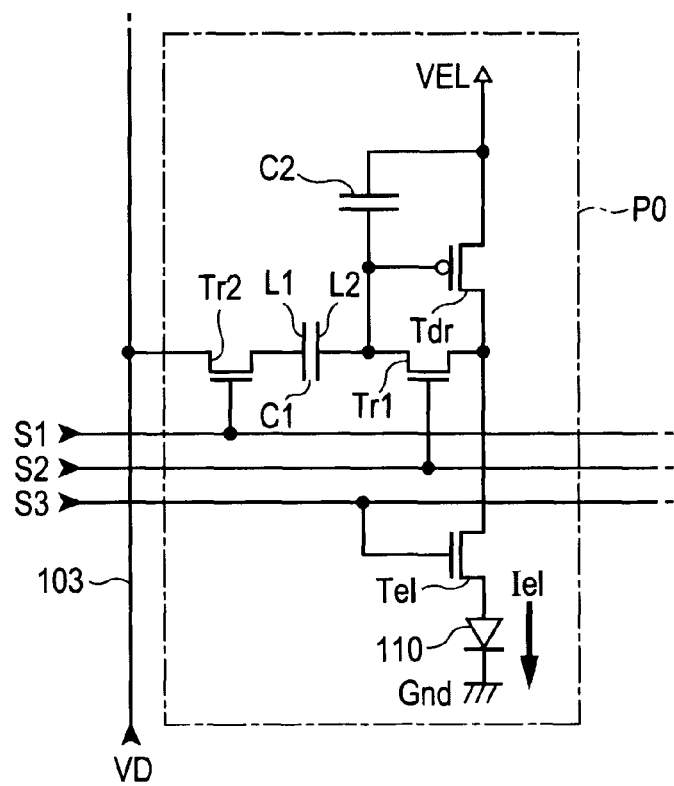
FIG. 17 is a circuit diagram that schematically illustrates an example of the configuration of a conventional pixel circuit.
Figure 18:
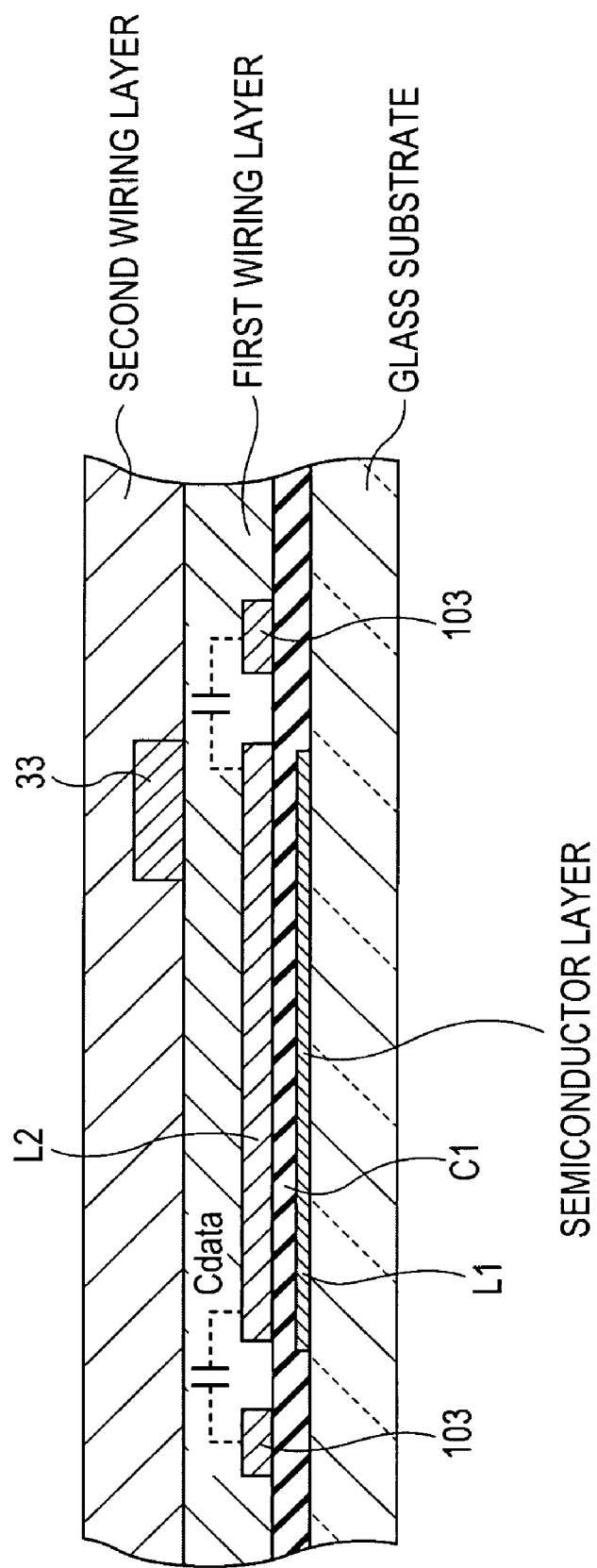
FIG. 18 is a plane view that schematically illustrates an example of the configuration of a conventional pixel circuit.

FIG. 16 illustrates an example of the configuration of a personal digital assistant (PDA) that adopts the electro-optical device 1 according to any of the exemplary embodiments, including variation examples thereof, described above. A personal digital assistant 4000 is provided with a plurality of manual operation buttons 4001, a power switch 4002, and the electro-optical device 1 functioning as a display device thereof. As a user manipulates the power switch 4002, various kinds of information including but not limited to an address list or a schedule table is displayed on the electro-optical device 1.

Among a variety of electronic apparatuses to which the electro-optical device according to the present invention is applicable are, other than the specific examples illustrated in FIGS. 14-16, a digital still camera, a television, a video camera, a car navigation device, a pager, an electronic personal organizer, an electronic paper, an electronic calculator, a word processor, a workstation, a videophone, a POS terminal, a printer, a scanner, a copier, a video player, a touch-panel device, and so forth. It should be noted that the application/use of the electro-optical device according to the invention is not limited to image display. For example, the electro-optical device according to the invention can be used as a writing head that is employed in various kinds of image formation apparatuses including, without any limitation thereto, an optical-writing type printer and electronic copying machine, where the writing head "light-exposes" a photosensitive member in accordance with an image that is to be formed on a recording target object such as a sheet of paper. The term "electronic circuit" is defined to include not only pixel circuits each of which constitutes a pixel of a display device as explained in the exemplary embodiments, including variation examples thereof, described above but also a plurality of circuits each of which constitutes a unit of light exposure performed in the image formation apparatus.

The entire disclosure of Japanese Patent Application Nos: 2006-267587, filed Sep. 29, 2006 and 2007-167251, filed Jun. 26, 2007 are expressly incorporated by reference herein.

What is claimed is:

1. An electro-optical device comprising:
a scanning line;
a data line;
a unit circuit that is provided corresponding to intersection of the scanning line and the data line; and
a power source line that supplies a power source voltage, the unit circuit including:
an electro-optical element that is driven by a driving current;
a driving transistor that is arranged between the power source line and the electro-optical element and sets the driving current according to a voltage of a gate of the driving transistor,
a first capacitative element that is provided with a first electrode and a second electrode,
a first switching element that controls electric connection between the data line and the second electrode based on a control signal that is supplied via the scanning line, and
a second capacitative element that is provided with a third electrode and a fourth electrode,
the first electrode being connected to the gate of the driving transistor,
the third electrode being connected to the gate of the driving transistor,
the second and fourth electrodes being formed directly on an insulating layer directly on which the data line is formed and being arranged as electrodes separated from each other, and
the fourth electrode being arranged between the data line and the second electrode.

2. The electro-optical device as set forth in claim 1, further comprising:
a potential line that supplies a predetermined potential, the first capacitative element being arranged between the second capacitative element and the potential line.

3. The electro-optical device as set forth in claim 1, the first capacitative element being arranged between an area at which the electro-optical element is provided and the second capacitative element.

4. The electro-optical device as set forth in claim 1, the first and third electrodes being arranged as common electrodes.

5. The electro-optical device as set forth in claim 1, the first and third electrodes being arranged in a layer different from that of the data line.

6. An electro-optical device comprising:
a scanning line;
a data line;
a unit circuit that is provided corresponding to intersections of the scanning line and the data line;

a power source line that supplies a power source voltage; and a potential line that supplies a predetermined potential, the unit circuit including:

a driving transistor that sets a driving current according to a voltage of a gate of the driving transistor, an electro-optical element that is driven by the driving current;

a first capacitative element that is provided with a first electrode and a second electrode, a second capacitative element that is provided with a third electrode and a fourth electrode, a first switching element that controls electric connection between the data line and the second electrode based on a control signal that is supplied via the scanning line, a second switching element, and a third switching element that controls electric connection between the first electrode and the potential line, the driving transistor having a first terminal and a second terminal, the first terminal being connected to the power source line, the first electrode being connected to the gate of the driving transistor, the third electrode being connected to the gate of the driving transistor, the second switching element controlling electric connection between the second terminal and the gate of the driving transistor, and the second and fourth electrodes being formed directly on an insulating layer directly on which the data line is formed and being arranged as electrodes separated from each other, and the fourth electrode being arranged between the data line and the second electrode.

7. An electronic apparatus comprising the electro-optical device as set forth in claim 1.

* * * * *